United States Patent
Cheng et al.

(10) Patent No.: US 8,946,666 B2
(45) Date of Patent: Feb. 3, 2015

(54) GE-RICH GST-212 PHASE CHANGE MEMORY MATERIALS

(75) Inventors: Huai-Yu Cheng, White Plains, NY (US); Hsiang-Lan Lung, Ardsley, NY (US); Simone Raoux, New York, NY (US); Yen-Hao Shih, Elmsford, NY (US); Matthew J. Breitwisch, Pound Ridge, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/327,595

(22) Filed: Dec. 15, 2011

(65) Prior Publication Data

US 2012/0326111 A1  Dec. 27, 2012

Related U.S. Application Data

(60) Provisional application No. 61/500,446, filed on Jun. 23, 2011.

(51) Int. Cl.
*H01L 29/02* (2006.01)
*H01L 21/06* (2006.01)
*H01L 21/20* (2006.01)
(Continued)

(52) U.S. Cl.
CPC ............ *H01L 45/06* (2013.01); *H01L 45/1233* (2013.01); *H01L 45/144* (2013.01); *H01L 45/1625* (2013.01)
USPC ................ 257/2; 438/102; 438/478; 365/163

(58) Field of Classification Search
CPC ...... H01L 45/06; H01L 45/144; H01L 45/143; G11C 13/0004; G11C 11/5678
USPC ........... 257/2–5, E45.001, E21.004, E47.001, 257/E45.002, E21.068, E21.002, E21.645, 257/E27.004, E47.005, E21.003, E21.09, 257/E21.52, E21.531, E27.081, E29.255, 257/314; 365/148, 163, 174.208, 145, 158, 365/189.06, 89.15, 191, 189.05, 189.07, 365/189.16, 203, 230.06, 189.09, 194, 365/230.03, 49.1; 438/102, 381, 129, 17, 3
See application file for complete search history.

(56) References Cited

U.S. PATENT DOCUMENTS

| 4,177,475 A | 12/1979 | Holmberg |
| 5,596,522 A | 1/1997 | Ovshinsky et al. |
| 5,825,046 A | 10/1998 | Czubatyj et al. |

(Continued)

OTHER PUBLICATIONS

Cheng, H-Y et al., "The Crystallization Behavior of Ge1SbxTe1 Phase-Change Materials," unpublished presentation materials, 2010 MRS Spring Meeting, Apr. 5-8, 2010, 30 pp.
(Continued)

*Primary Examiner* — Colleen A Matthews
*Assistant Examiner* — Junaiden Mirsalahuddin
(74) *Attorney, Agent, or Firm* — Yiding Wu; Haynes Beffel & Wolfeld LLP

(57) ABSTRACT

A phase change material comprises $Ge_xSb_yTe_z$, wherein a Ge atomic concentration x is within a range from 30% to 65%, a Sb atomic concentration y is within a range from 13% to 27% and a Te atomic concentration z is within a range from 20% to 45%. A Ge-rich family of such materials is also described. A memory device, suitable for integrated circuits, comprising such materials is described.

12 Claims, 22 Drawing Sheets

(51) Int. Cl.
*G11C 11/00* (2006.01)
*H01L 45/00* (2006.01)

(56) References Cited

U.S. PATENT DOCUMENTS

| | | | |
|---|---|---|---|
| 6,033,535 A | 3/2000 | Ohno et al. | |
| 6,087,674 A | 7/2000 | Ovshinsky et al. | |
| 6,088,269 A | 7/2000 | Lambertson | |
| 6,143,636 A | 11/2000 | Forbes et al. | |
| 6,800,504 B2 | 10/2004 | Li et al. | |
| 6,956,261 B2 | 10/2005 | Shibata | |
| 7,355,238 B2 | 4/2008 | Takata et al. | |
| 7,453,081 B2 | 11/2008 | Happ et al. | |
| 7,679,163 B2 | 3/2010 | Chen et al. | |
| 7,745,807 B2 | 6/2010 | Chen et al. | |
| 7,759,770 B2 | 7/2010 | Happ et al. | |
| 7,800,159 B2 | 9/2010 | Widjaja et al. | |
| 7,800,943 B2 | 9/2010 | Ravasio et al. | |
| 7,875,873 B2 | 1/2011 | Chen et al. | |
| 7,893,419 B2 | 2/2011 | Hudgens et al. | |
| 7,893,420 B2 | 2/2011 | Liang et al. | |
| 7,913,215 B2 | 3/2011 | Chou et al. | |
| 8,192,592 B2 | 6/2012 | Kim et al. | |
| 2004/0109351 A1 | 6/2004 | Morimoto et al. | |
| 2006/0049447 A1 | 3/2006 | Lee et al. | |
| 2006/0118853 A1 | 6/2006 | Takata et al. | |
| 2006/0126423 A1 | 6/2006 | Aratani et al. | |
| 2007/0029606 A1 | 2/2007 | Noh et al. | |
| 2007/0097739 A1 | 5/2007 | Happ et al. | |
| 2007/0171705 A1* | 7/2007 | Parkinson | 365/163 |
| 2007/0267620 A1 | 11/2007 | Happ | |
| 2007/0267721 A1 | 11/2007 | Kuh et al. | |
| 2008/0017842 A1 | 1/2008 | Happ et al. | |
| 2008/0035907 A1 | 2/2008 | Czubatyj et al. | |
| 2008/0191187 A1 | 8/2008 | Lung et al. | |
| 2008/0253166 A1* | 10/2008 | Raberg et al. | 365/148 |
| 2008/0272807 A1* | 11/2008 | Lowrey | 326/93 |
| 2009/0014704 A1 | 1/2009 | Chen et al. | |
| 2009/0078924 A1 | 3/2009 | Liang et al. | |
| 2009/0230375 A1* | 9/2009 | Liang et al. | 257/2 |
| 2010/0044665 A1 | 2/2010 | Jedema | |
| 2010/0051895 A1* | 3/2010 | Hampton | 257/4 |
| 2010/0054029 A1* | 3/2010 | Happ et al. | 365/163 |
| 2010/0328996 A1 | 12/2010 | Shih et al. | |
| 2011/0049456 A1 | 3/2011 | Lung et al. | |
| 2011/0084240 A1* | 4/2011 | Schell et al. | 252/572 |
| 2011/0110018 A1 | 5/2011 | Ishii et al. | |
| 2011/0140066 A1 | 6/2011 | Liang et al. | |
| 2011/0207284 A1* | 8/2011 | Tominaga et al. | 438/381 |

OTHER PUBLICATIONS

Kojima, R. et al., "Acceleration of Crystallization Speed by Sn Addition to Ge—Sb—Te Phase-Change Recording Material," Jpn. J. Appl. Phys., vol. 40, Part 1, No. 10, Oct. 2001, pp. 5930-5937.

Yamada, N. et al., "High Speed Overwritable Phase Change Optical Disk Material," Proc. Int. Symp. on Optical Memory, Tokyo, Jpn. J. Appl. Phys., vol. 26, (1987) Supplement 26-4, pp. 61-66.

Cheng H-Y et al., "The crystallization behavior of Ge1SbxTe1 phase-change materials," abstract of invited paper for Apr. 2010 MRS Spring Meeting, 2pp.

N. Yamada et al., "Rapid-phase transitions of GeTe—Sb2Te3 pseudobinary amorphous thin films for an optical disk memory," J. Appl. Phys. 69(5), Mar. 1991, pp. 2849-2856.

E. Morales-Sanchez, "Structural, electric and kinetic parameters of ternary alloys of GeSbTe," Thin Solid Films, vol. 471, 2005, pp. 243-247.

N. Matsuzaki et al., "Oxygen-doped GeSbTe Phase-change Memory Cells Featuring 1.5-V/100-µA Standard 0.13-µm CMOS Operations," IEDM Tech. Digest, vol. 758, 2005, 4pp.

M. Okuda et al., "Explosive Crystallization Mechanism in Sb-rich Eutectic Materials of Phase Change Optical Memory," Mater. Res. Soc. Proc. vol. 803, Jan. 2003, 7pp.

L. Van Pieterson, et al., "Phase-change recording materials with a growth-dominated crystallization mechanism: A materials overview," J. Appl. Phys. vol. 97:083520, 2005, 7pp.

Y.H. Shih et al., "Understanding Amorphous States of Phase-Change Memory Using Frenkel-Poole Model," IEDM Tech. Digest, vol. 207, 2009, pp. 31.7.1-31.7.4.

Chinese Office Action dated Feb. 27, 2014 for Application No. 201210112127.3.

Taiwanese Office Action dated May 30, 2014 for Applicatin No. 101116433.

* cited by examiner

*PRIOR ART GST-225*

GE-RICH GST-212 PHASE CHANGE MEMORY MATERIALS

RELATED APPLICATION

Benefit is claimed of U.S. Provisional Application No. 61/500,446 entitled "Ge-Rich GST-212 Phase Change Memory Materials" filed 23 Jun. 2011.

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND OF THE INVENTION

1. Field of the Invention

The present technology relates to high density memory devices based on phase change based memory materials.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state.

In phase change memory, data is stored by causing transitions in an active region of the phase change material between amorphous and crystalline states. The difference between the highest resistance $R_1$ of the low resistance crystalline set state and the lowest resistance $R_2$ of the high resistance amorphous reset state defines a read margin used to distinguish cells in the crystalline set state from those in the amorphous reset state. The data stored in a memory cell can be determined by determining whether the memory cell has a resistance corresponding to the low resistance state or to the high resistance state, for example by measuring whether the resistance of the memory cell is above or below a threshold resistance value within the read margin.

Materials within the GST-225 family include GeSbTe compositions along the $Sb_2Te_3$ and GeTe tie line as reported in "Structural, electric and kinetic parameters of ternary alloys of GeSbTe", E. Morales-Sanchez, Thin Solid Films 471 (2005) 243-247. It has been observed that conventional phase change memory cells fabricated from materials in the GST-225 family undergo undesired transformation from the amorphous reset state to the crystalline set state at elevated temperatures. The undesired transformation of the phase change material within the active region of memory cells within an array at elevated operation temperatures leads to the creation of false data and the loss of desired stored data.

Efforts to improve the thermal stability of GST-225 phase change memory cells have resulted in memory cells that operate at slower set and reset speeds at higher reset currents with a decrease in the difference between the low resistance of the crystalline set state and the high resistance of the amorphous reset state.

It is desirable therefore to provide a phase change memory material with a higher crystallization temperature to prevent undesired transformation from the amorphous reset state to the crystallized set state at elevated operation temperatures. It is further desirable that the phase change memory material maintain a large difference between the range of reset state resistance values and the range of set state resistance values. It is also desirable that the phase change memory material has a higher crystallization temperature while still retaining fast set and reset speeds. Finally, it is desirable that the phase change memory material be capable of being transformed from a set crystalline state to a reset crystalline state at a lower reset current than that of conventional GST-225 phase change memory material.

SUMMARY

Phase change memory materials in a GST-212 family of materials, and a Ge-rich GST-212 family of materials are described that can have higher crystallization temperatures, lower reset current requirements and better retention characteristics than the typical GST-225 phase change memory material used in the art. The materials within the GST-212 family have crystallization temperatures higher than 170° C. The materials maintain a high crystallization temperature while having a fast set speed as compared to GST-225 phase change memory material. The phase change memory materials within the GST-212 family have a reduced reset current compared to materials within the GST-225 family. The phase change memory materials, described herein, do not form large voids and do not retain large variations in grain size after exposure to elevated temperatures during back-end-of-line (BEOL) processing. Furthermore, the phase change memory materials, described herein, remain in the amorphous reset state after prolonged exposure to elevated temperatures. The phase change memory materials within the GST-212 family maintain a large difference in resistance between the high resistance of the amorphous reset state and the low resistance of the crystalline set state at elevated temperatures and after repeated operation cycles. The materials within the GST-212 family crystallize with a growth dominated mechanism as opposed to materials within the GST-225 family that crystallize through a nucleation dominated mechanism.

Memory cell devices fabricated from a phase change memory material from the GST-212 family that have a higher crystallization temperature than GST-225 are described herein. The memory cell devices include an array of memory cells. Each memory cell includes a first electrode and a second electrode coupled to a memory cell memory element. The memory element includes an active region in which the phase transformation between the set and reset states substantially occurs.

Methods for manufacturing memory cell devices using a phase change memory material with a higher crystallization temperature than GST-225 are described herein.

Other aspects and advantages of the present invention can be seen on review of the drawings, the detailed description, and the claims which follow.

DETAILED DESCRIPTION

A detailed description of embodiments of the present invention is provided with reference to the FIGS. 1-22.

Figure 1:
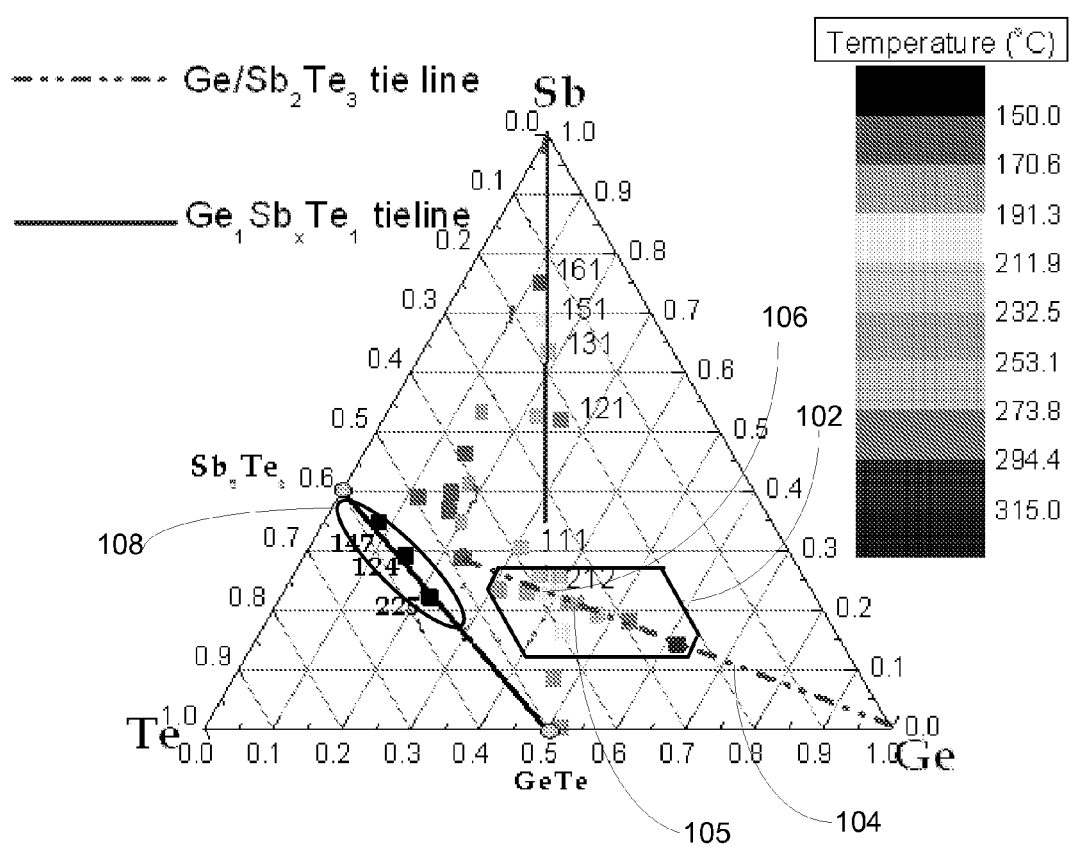
FIG. 1 is a ternary phase diagram with the crystallization temperature of GST compositions at various atomic percentage concentrations.

FIG. 1 is a ternary phase diagram that shows the crystallization temperature using gray scale coding of spots at locations that correspond to GeSbTe (hereinafter GST) compositions at various atomic percentage concentrations. In one embodiment, the high crystallization temperature compositions described here are located generally along the $Ge/Sb_2Te_3$ tie line 104, encompassing materials with concentrations similar to $Ge_2Sb_1Te_2$, including $Ge_2Sb_1Te_2$. A group of materials, termed herein the "GST-212 family" of materials encompassed by shape 102 includes the group of $Ge_xSb_y$-$Te_z$ wherein the Ge atomic percentage concentration is within a range from 30% to 65%, the Sb atomic percent concentration is within a range from 13% to 27% and the Te atomic percent concentration is within a range from 20% to 45%. A group of materials, termed here the "Ge-rich GST-212 family" of materials includes those materials within the shape 102, where the minimum concentration of Ge is 40%. Materials described herein within the Ge-rich GST-212 family can have crystallization temperatures greater than 200° C., which is at least 50° C. greater than that typical of materials in the GST-225 family. In addition, the materials described herein are operable with low reset currents, which can be around 30% lower than that typical for materials in the GST-225.

An important factor for developing new phase change materials is the resistance of phase-change materials. The resistance in the crystalline state is important in particular, because it determines the reset current which the device requires. For GST-225, the resistance in the crystalline state is very low, so it needs very high reset current for reset. We have discovered the GST-212 family and the "Ge-rich GST-212 family." The higher Ge concentration leads to higher resistance of crystalline state, and therefore lower reset current it is required.

So, the resistance of Ge-rich GST-212 is close to that of GST-212, and both have greater resistance than Ge-poor GST-212. The reset current of Ge-rich GST-212 is close to that of GST-212 and both are lower than Ge-poor GST-212. For comparison between GST-212 and Ge-rich GST-212, the transition temperature Tx is higher for Ge-rich GST-212, so the retention can be further improved.

Comparing with GST-225, our Ge-rich GST-212 is the material with high Tx, and high resistance of crystalline state, which combine to result in low reset current, good endurance, while having a fast enough speed (slower than GST-225, but still fast enough).

The Ge-rich GST-212 family of materials includes those materials around the $Ge$—$Sb_2Te_3$ phase diagram tie line 104 on the higher Ge concentration side of the point on the tie line where the tie line passes most closely to the $Ge_2Sb_1Te_2$ point within the phase diagram. The Ge-rich GST-212 family of materials is illustrated in FIG. 1 as those materials with compositions that are within the area encompassed by shape 102, that have crystallization temperatures above 200° C. A representative composition is the GeSbTe material at location 105 in FIG. 1 shows excellent characteristics in testing, with a atomic percentage concentration of Ge around 42.9%, a atomic percentage concentration of Sb around 20.5% and a atomic percentage concentration of Te around 36.6% (hereinafter "representative composition"). The improved performance characteristics of such representative composition include a crystallization temperature of around 250° C. The increased crystallization temperature improves data retention and device performance at elevated temperatures. Furthermore, the improved performance characteristics also include a 30% less reset current than the reset current typically required for memory devices fabricated from the GST-225 family of materials. The decreased reset current allows for easier device programming at lower power levels.

The GST-225 family of materials is illustrated in FIG. 1 as those materials with compositions that fall within the area encompassed by oval 108. Such GST-225 family of materials includes the GeSbTe compositions that are along or near the $Sb_2Te_3$—GeTe tie line in the ternary phase diagram. As shown in the ternary phase diagram, the compositions within the GST-225 family of materials have a crystallization temperature below 150° C. Such low crystallization temperature results in decreased data retention for phase change memory devices operated at higher temperatures. As the temperature is increased, a portion of the amorphous phase change material begins to crystallize from the amorphous reset state to the crystallized set state. It is the difference in resistivity between the crystalline set state and the amorphous reset state of the phase change material that is used to store the data. Therefore, if the phase change material within the memory cells is transformed from an amorphous to crystalline state at elevated temperatures, false data is created and stored within the memory device. Furthermore, transformations from amorphous to crystalline states at elevated temperatures lead to a loss of desired stored data. Thus, low crystallization temperature leads to poor data retention within the memory devices and a degradation of desired memory device performance characteristics.

Increased crystallization temperatures are also observed for materials within the Ge-poor GST-212 family of materials. The Ge-poor GST-212 family of materials include those materials within the shape 102 shown in FIG. 1 having a Ge percentage atomic concentration ranging from 30% to 40%. The materials within the Ge-poor GST-212 family do not have as a dramatic increase of crystallization temperature as those materials in the Ge-rich GST-212 family. However, the materials within the Ge-poor GST-212 family still have crystallization temperatures of between 170° C. to over 200° C.

Materials described herein can be doped with impurities to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Pat. No. 7,893,419. Therefore, materials within the GST-212 family can be doped with impurities to further increase the crystallization temperature, lower the reset current and enhance other desired material performance aspects.

The materials within the Ge-rich GST-212 family, as shown in FIG. 1, have a higher crystallization temperature than materials in the GST-225 family. Representative materials within the Ge-rich GST-212 family have crystallization temperatures that range from around 200° C. to around 315° C. The higher crystallization temperature of materials within the Ge-rich GST-212 family leads to improved device performance and data retention. Specifically, at elevated operation temperatures, the phase change memory material is not transformed from an amorphous reset state into a crystalline set state, which leads to a decrease in preferred performance characteristics through the creation of false data and the loss of desired stored data.

Figure 2:
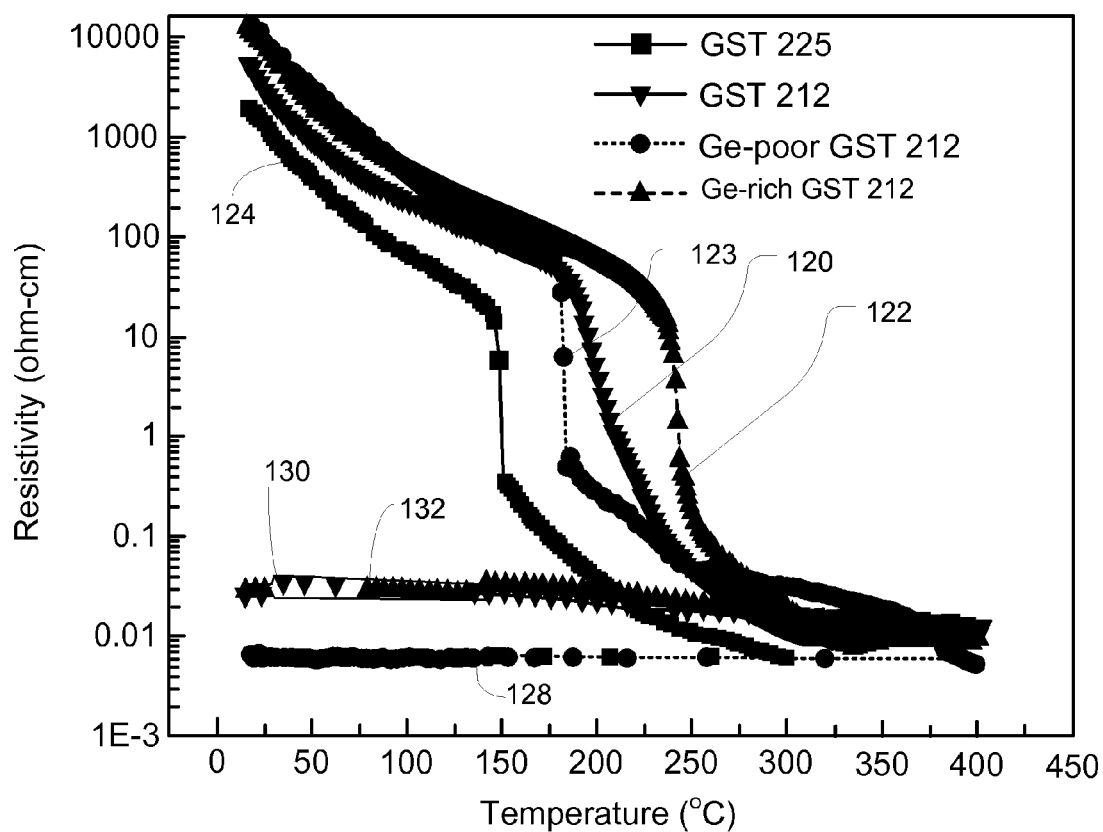
FIG. 2 is a diagram that illustrates the resistivity of materials with the GST-212 family and the GST-225 family as a function of temperature.

FIG. 2 compares the resistivity vs. temperature curves of the GST-225 (trace 124), GST-212 (trace 120), Ge-poor GST 212 (trace 123), and Ge-rich GST 212 (trace 122) compositions. In addition to higher transition temperatures Tx, the representative composition in the Ge-rich GST-212 family shows higher resistance in the crystalline state than GST-225, which also helps reducing the reset current.

The resistivity of GST-225 124 begins to dramatically decrease at a temperature of around 150° C. This shows that the crystallization temperature of GST-225 is around 150° C. The resistivity of GST-212 120 begins to dramatically decrease at around 200° C., indicating that the crystallization temperature of GST-212 is around 200° C. This is nearly a 50° C. higher crystallization temperature than GST-225, thus achieving desired performance characteristics and improved data retention at elevated temperatures. The resistivity of the representative composition within the Ge-rich GST-212 family 124 begins to dramatically decrease at around 250° C., indicating a crystallization temperature of around 250° C.

The reset current that is required to transform materials of the GST-212 family from a crystalline set state to an amorphous reset state is around 30% less than the reset current for materials within the GST-225 family. The reset current is the amount of current that is required to transform the phase change memory material from a crystalline set state to an amorphous reset state. This reset current changes the temperature of a phase change memory material to a maximum melt temperature, so that a portion of the crystallized material melts. The melted portion of phase change material quenches quickly, thereby solidifying into an amorphous reset state. Alternatively, the set current is the amount of current that is required to transform the phase change memory material from an amorphous reset state to a crystalline set state. The set current causes the phase change memory material to rise above the crystallization temperature but below the maximum melt temperature, so that the phase change memory material crystallizes from the amorphous reset state.

As is shown in FIG. 2, the resistivity of the GST-225 material in a crystalline set state 128 is below 0.01 Ω-cm. The resistivities of the GST-212 materials in a crystalline set state 130 and of the representative composition in the Ge-rich GST-212 family in a crystalline set state 132 remain above 0.01 Ω-cm at around 0.05 Ω-cm across the entire range of temperatures. The resistance in the crystalline state is higher for materials within the GST-212 family of materials, including both GST-212 and the representative composition in the Ge-rich GST-212 family, than materials within the GST-225 family of materials. Thus, a lower reset current is required to transform the materials from the set crystalline state to the reset amorphous state. Therefore the materials within the GST-212 family can have a 30% lower reset current than those materials within the GST-225 family.

Figure 3:
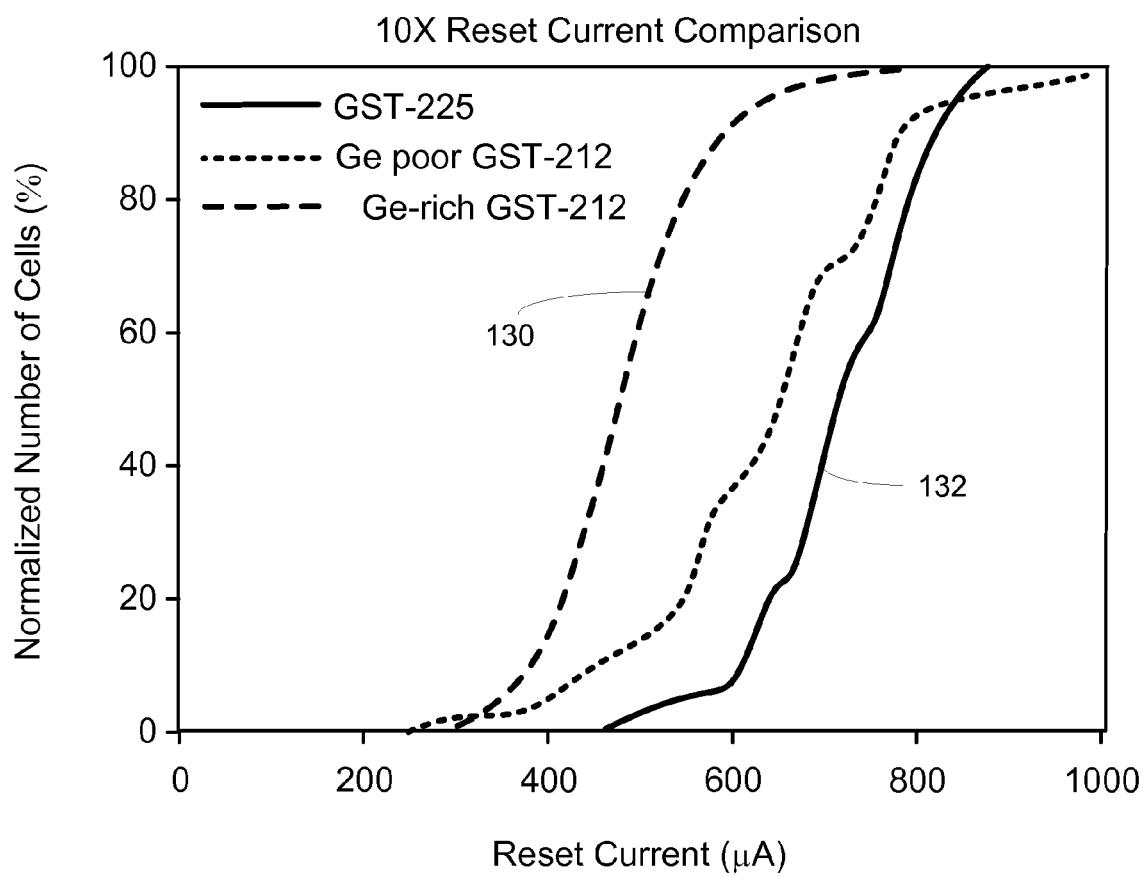
FIG. 3 is a plot of the reset current as a function of the normalized number of cells of materials from both the GST-212 family and the GST-225 family.

FIG. 3 is a plot of the reset current as a function of the normalized number of cells for various GST compositions that further illustrates the lowered reset current of the Ge-rich GST-212 family of materials. The reset current for a normalized number of cells fabricated from the representative composition in the Ge-rich GST-212 group represented by 130 is lower than the reset current for a normalized number of cells fabricated from a GST-225 material represented by 132. Specifically, the reset current for a 50% normalized number of cells fabricated from Ge-rich GST-212 is around 450 μA. The reset current for a 50% normalized number of cells fabricated from GST-225 is around 700 μA. This difference in reset current between Ge-rich GST-212 and GST-225 remains constant across the entire range of the percentage of normalized cells. Thus, the reset current that is required to transform materials from the set to the reset state in the Ge-rich GST-212 family is around 30% less than the reset current for those materials within the tested GST-225 family.

The representative materials within the GST-212 family are not likely to form a large number of voids during back-end-of-line (BEOL) processing as compared with the materials within the GST-225 family. Such voids that are introduced during BEOL processing trigger crystallization of amorphous material within the reset state at even lower temperatures continuously throughout the set and reset cycles associated with typical memory cell device performance. Thus, such voids further degrade desired performance characteristics by decreasing data retention rates and increasing the chances that false data is stored. Furthermore, large grain size variations are not created for materials within the Ge-rich GST-212 family during BEOL processing as are created for materials within the GST-212 family during BEOL processing. Such variation in grain sizes further serves to introduce defects within the material after repeated transformations between set and reset states during device operation. Such defects, as mentioned previously, trigger crystallization of amorphous phase change material, thereby degrading performance characteristics.

Figure 4:
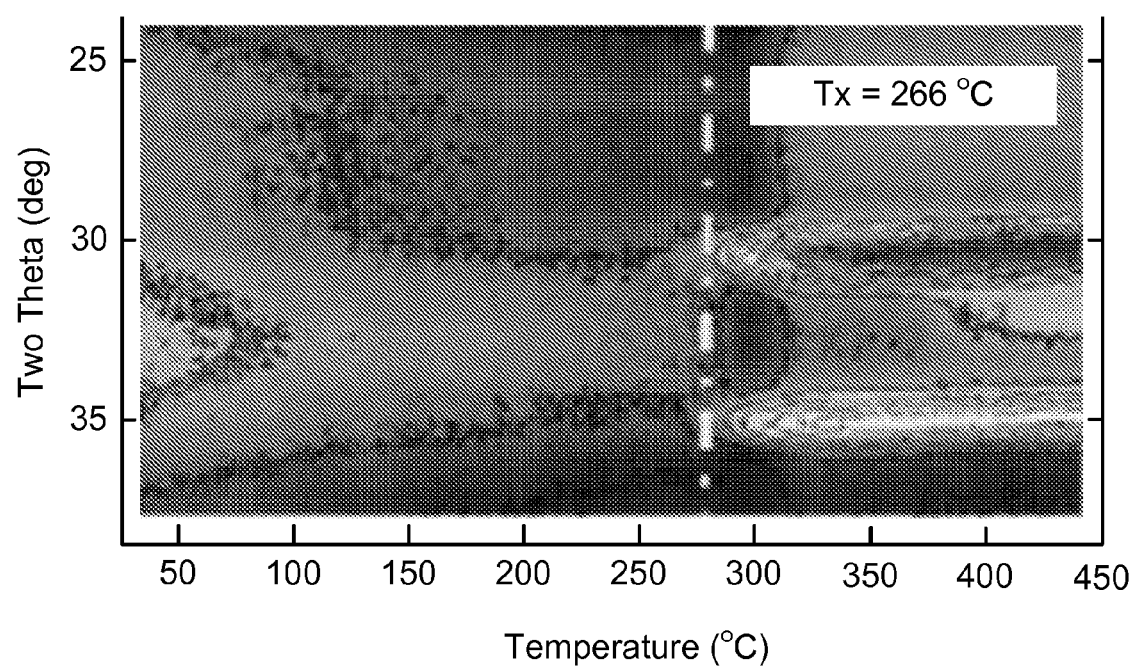
FIG. 4 is the time resolved XRD data as a function of temperature for a material within the GST-212 family.

The formation of voids and large variations in grain size during BEOL processing is attributed to the transition from the cubic crystalline structure to the hexagonal close packed (HCP) crystalline structure at the elevated temperatures of BEOL processing. The large column-like structure of GST materials in the HCP structure promotes creation of large voids and variations in the grain sizes within the material. FIG. 4 shows the time-resolved XRD data as a function of temperature for a material within the Ge-rich GST-212 family. It is apparent from FIG. 4 that at 266° C. the material within the Ge-rich GST-212 family has a substantially cubic crystalline structure. For purposes of comparison, for materials within the GST-225 family, the transition from a cubic crystalline structure to a HCP structure occurs at around 380° C. Materials within the GST-212 family can have a much higher temperature transition from cubic to hexagonal. For at least some materials in this group, the transition from a cubic crystalline structure to an HCP structure occurs at a temperature of greater than 500° C. for materials within the Ge-rich GST-212 family. Since BEOL processing occurs at temperatures around 400° C., materials within the Ge-rich GST-212 family do not transform into a crystalline HCP structure while materials within the GST-225 family do. Thus the voids and variations in grain size that are characteristic of materials with crystalline HCP structure are not present in the GST-212 family of materials after BEOL processing.

Figure 5A:
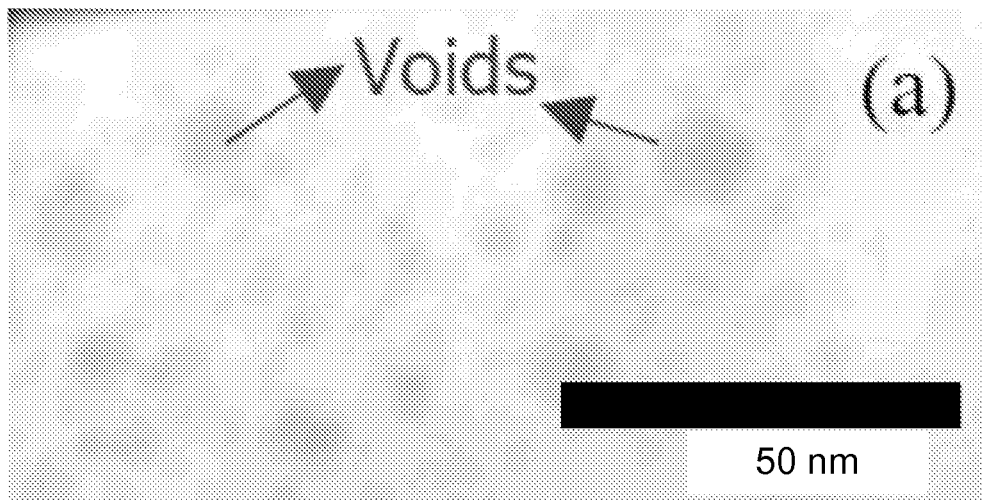
FIG. 5(a) is a transmission electron microscope (TEM) image of a material within the GST-225 family after back-end-of-line processing.
Figure 5B:
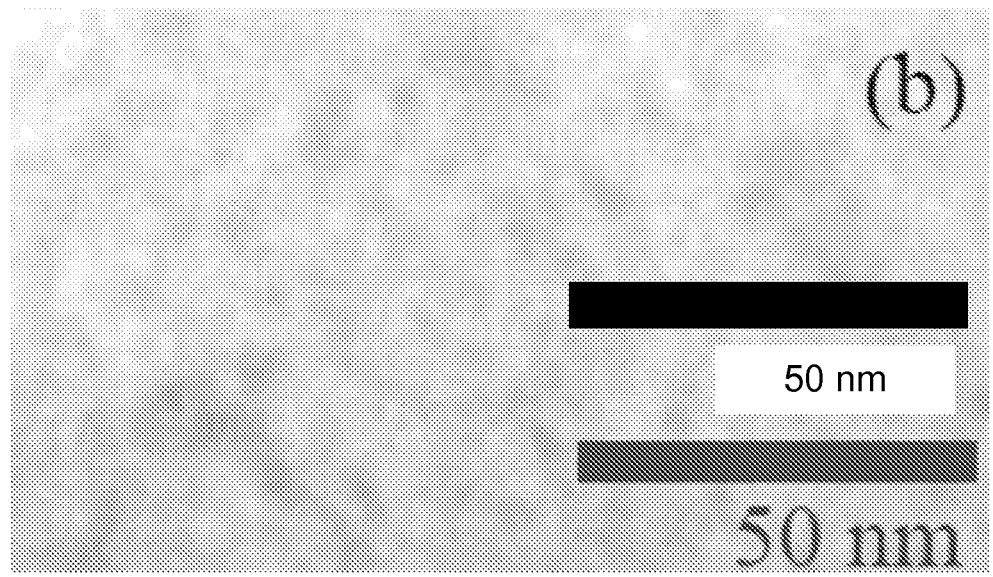
FIG. 5(b) is a TEM image of a material within the GST-212 family after BEOL processing.

FIG. 5(a) is a transmission electron microscope (TEM) image of a material within the GST-225 family after BEOL processing. FIG. 5(b) is a TEM image of the representative composition within the Ge-rich GST-212 family after BEOL processing. FIG. 5(a) illustrates voids in the size range of 20 nm are present in the material from GST-225 family. No such voids, however, are present in FIG. 5(b) the image of the representative composition from the Ge-rich GST-212 family. Furthermore it is apparent that there are large variations in grain size within the material in the GST-225 family. Such large variations in grain size are not present in the material in the Ge-rich GST-212 family, where the grain size remains constant at around 20 nm. Thus, after BEOL processing, defects including voids and large variations in grain size are not present in the material from the Ge-rich GST-212 family. This, in turn, improves device performance and reduces the chances of loss of data and of creation of false data.

The materials within the GST-212 family have a higher activation energy Ea than those materials within the GST-225 family. The Kissinger method was used to extract the activation energy for the representative composition with a atomic percentage concentration of Ge around 42.9%, a atomic percentage concentration of Sb around 20.5% and a atomic percentage concentration of Te around 36.6%. The Kissinger method was used based upon variations in the crystallization observed at different heating rates for the GeSbTe material.

The activation energy for the representative composition is 4.25 eV. Alternatively, the activation energy for the material within the GST-225 family is only 2.65 eV. The representative composition has an activation energy that is nearly 2 eV higher than the material in the GST-225 family. This higher activation energy is indicative of the higher crystallization temperature of the materials within the GST-212 family. Specifically, a higher amount of thermal energy is necessary to start the transformation from the crystalline set state to the amorphous reset state. The materials within the Ge-rich GST-212 family are capable of receiving more thermal energy before transforming into the crystalline state from the amorphous state, consequently resulting in a higher crystallization temperature. The advantages of a higher crystallization temperature were discussed previously.

Figure 6A:
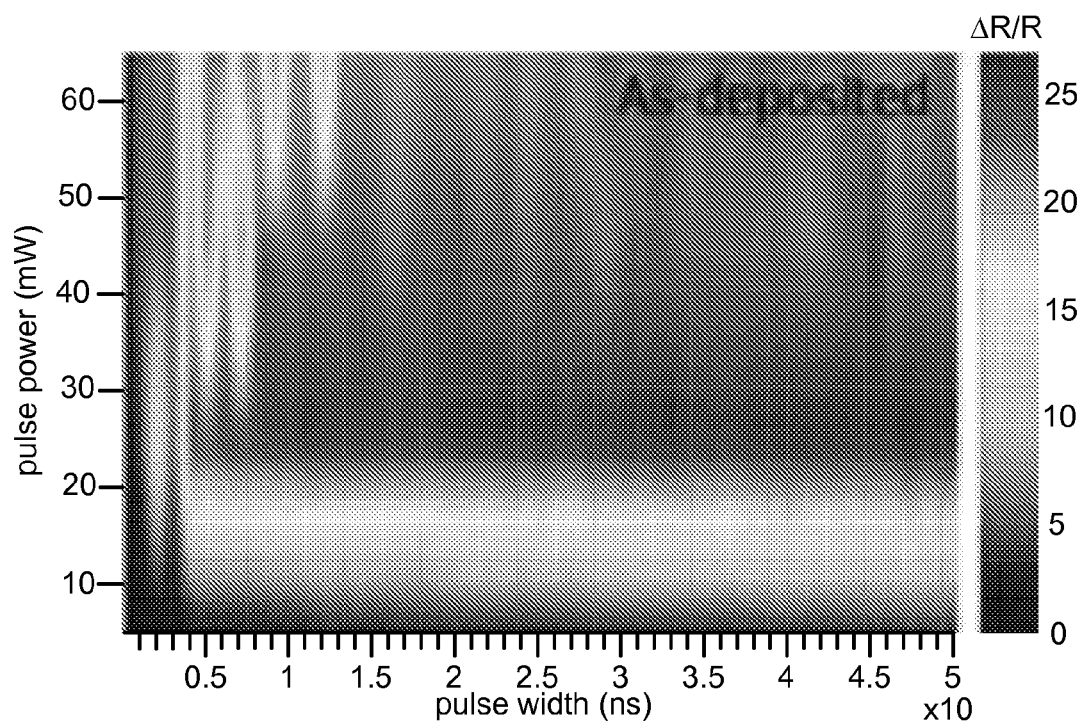
FIG. 6(a) is a plot of the change in reflectivity as a function of laser power and duration for an as-deposited sample of a material within the GST-212 family.
Figure 6B:
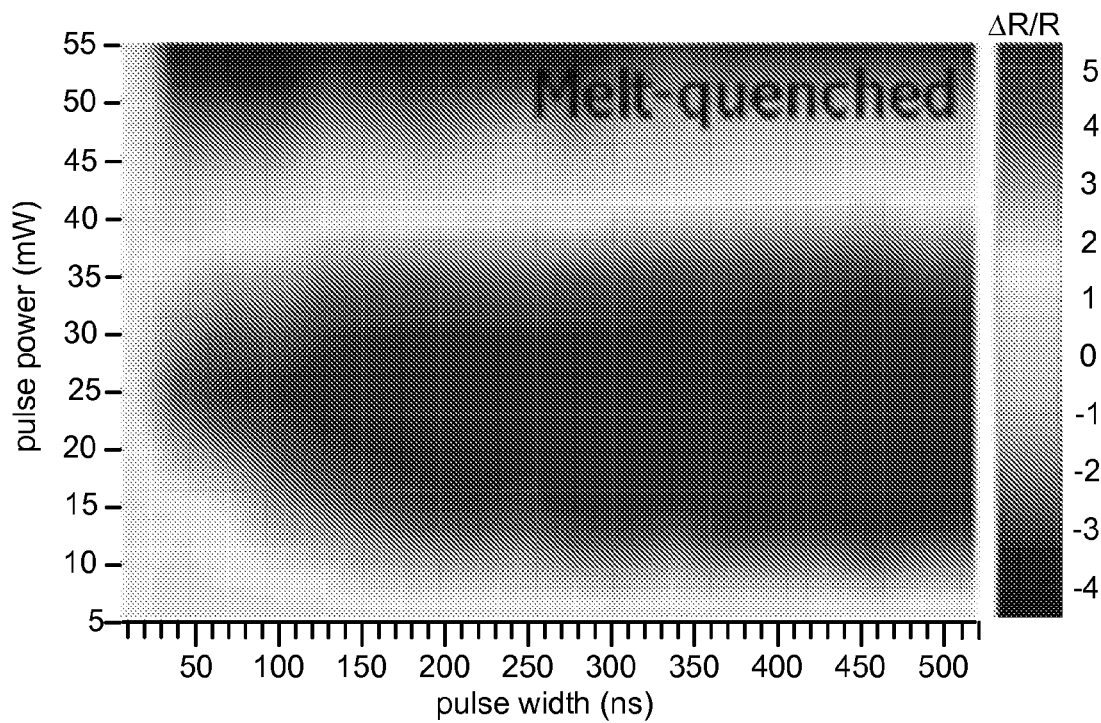
FIG. 6(b) is a plot of the change in reflectivity as a function of laser power and duration for a laser melt quenched sample of a material within the GST-212 family.

FIGS. 6(a) and 6(b) show the change in reflectivity as a function of laser power and duration for as-deposited, FIG. 8(a), and laser melt quenched, FIG. 8(b), for the representative composition. As is shown in FIG. 8(b) a laser pulse of 40 ns/at 40 mW was sufficient to generate a transformation from a crystalline set state to an amorphous reset state. Such 40 ns pulse time is comparable to the pulse time, around 30 ns, for transforming material from the GST-225 family from a crystalline set state to an amorphous reset state.

Figure 7A:
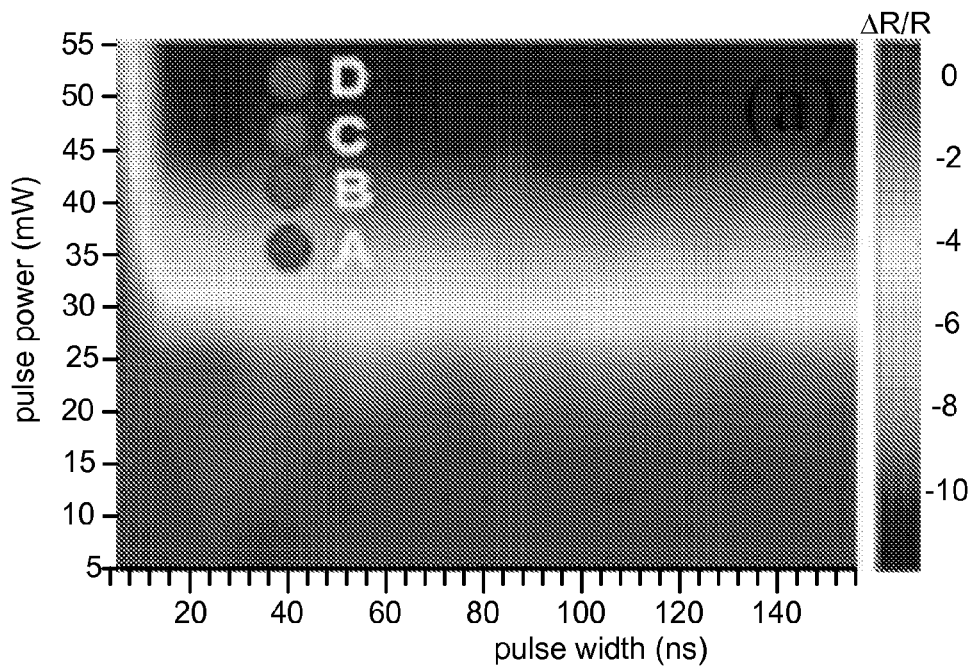
FIG. 7(a) is the amorphization cartography of a sample of material with optimum performance characteristics from the GST-212 family from a crystalline set state.
Figure 7B:
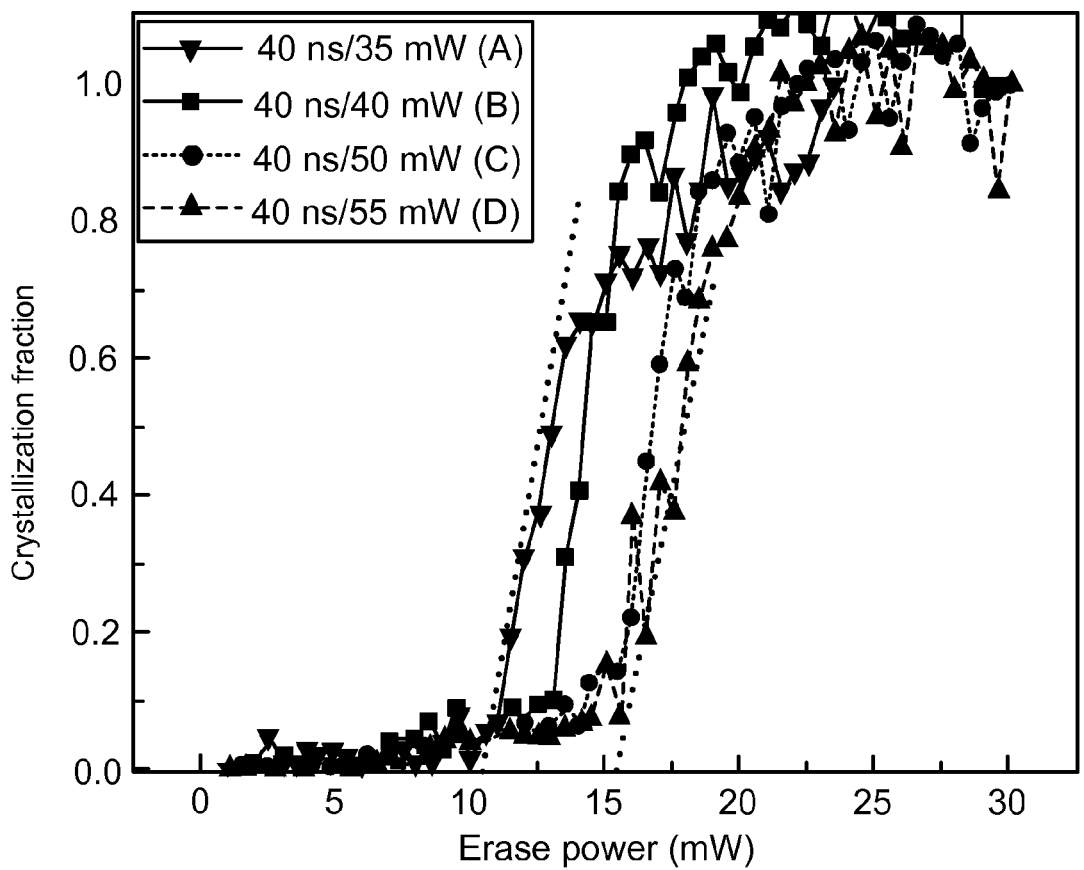
FIG. 7(b) plots the crystallization fraction as a function of erase power at various erase power pulse times for a material with optimum performance characteristics form the GST-212 family.

FIG. 7(a) illustrates the amorphization cartography from a sample of the representative composition with a atomic percentage concentration of Ge around 42.9%, a atomic percentage concentration of Sb around 20.5% and a atomic percentage concentration of Te around 36.6% from a crystalline set state. FIG. 7(b) illustrates the crystallization fraction of a sample of the representative composition as a function of the erase power. It is clear that the erase power is directly related to the writing conditions. This indicates that crystallization of materials within the GST-212 family occurs through a growth dominated transformation process rather than a nucleation dominated process, as is observed for materials within the GST-225 family. As the crystallization of materials within the GST-212 family of materials occurs through a growth dominated mechanism rather than a nucleation dominated mechanism, the presence of defects within the material does not promote crystallization as easily. Thus, materials from the GST-212 family do not crystallize at temperatures as low as those of materials from the GST-225 family when defects are present.

Figure 8:
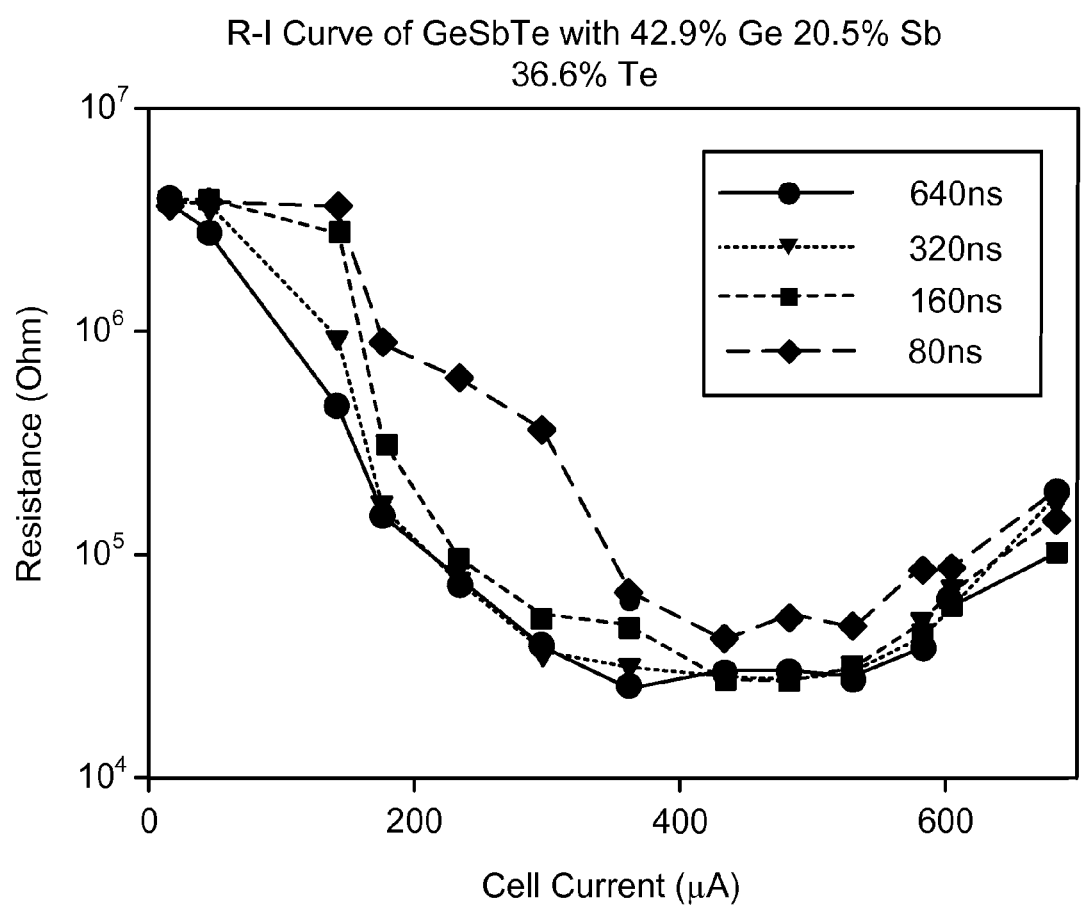
FIG. 8 is an R-I curve of a phase change memory device fabricated from a material with optimum performance characteristics from the GST-212 family.
Figure 9:
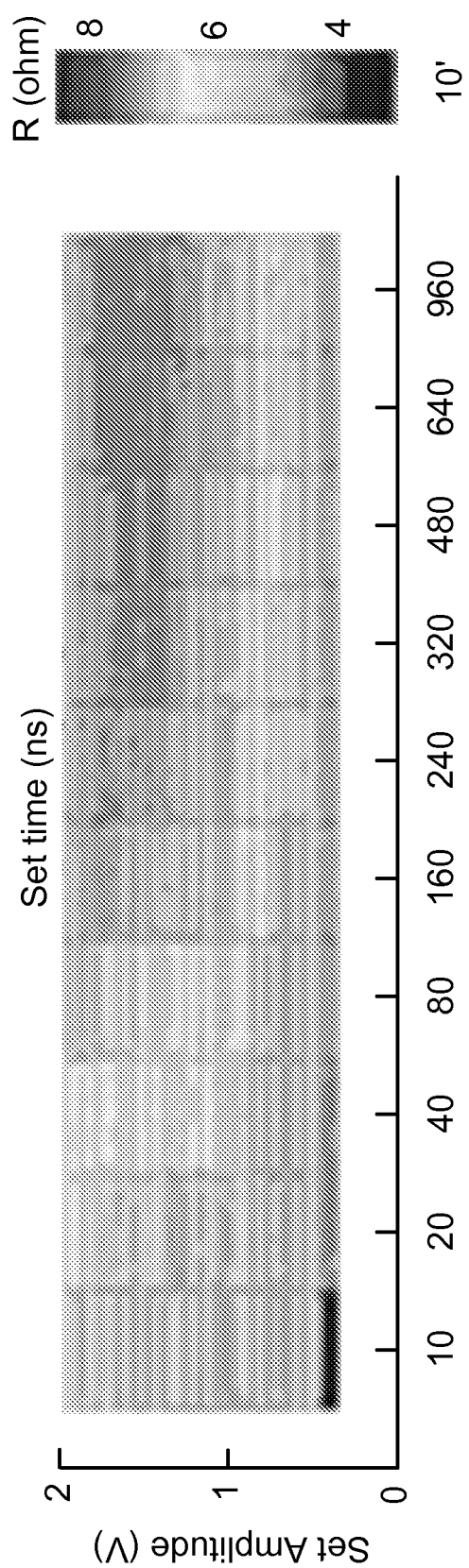
FIG. 9 is a Shmoo plot of the crystalline set state resistance as a function of the set speed for a material with optimum performance characteristics from the GST-212 family.

The time needed to transform materials within the GST-212 family from the amorphous reset state to the crystalline set state, also known as the set speed, is similar to the set speed for materials within the GST-225 family. FIG. 8 shows an R-I curve of a phase change memory device fabricated from the representative composition, with a atomic percentage concentration of Ge around 42.9%, a atomic percentage concentration of Sb around 20.5% and a atomic percentage concentration of Te around 36.6%. The memory cells tested in FIG. 10 have first electrodes ranging from 30 nm to 50 nm. As is shown in FIG. 8, the resistance drops from the amorphous reset state resistance of between $10^6 \Omega$ and $10^7 \Omega$ to the crystalline set state resistance of below $10^5 \Omega$ using an 80 ns set pulse current. This set pulse current time is further illustrated in FIG. 9 which is a Shmoo plot of the crystalline set state resistance as a function of set time. The memory cells tested to generate the data for FIG. 9 are the same previously mentioned memory cells that were used to generate the data for FIG. 8. As is evident from FIG. 9, a crystalline set state resistance of 100 kΩ is achieved in as little as an 80 ns set speed. The 80 ns set speed of materials within the Ge-rich GST-212 family is comparable to the set speed in devices fabricated from materials within the GST-225 family. Thus, adding Ge to form a material of the GST-212 family improves memory cell performance at higher temperatures, while still preserving a fast SET speed. Such fast set speed is a beneficial characteristic of memory cells fabricated from materials in the GST-225 family.

Figure 10:
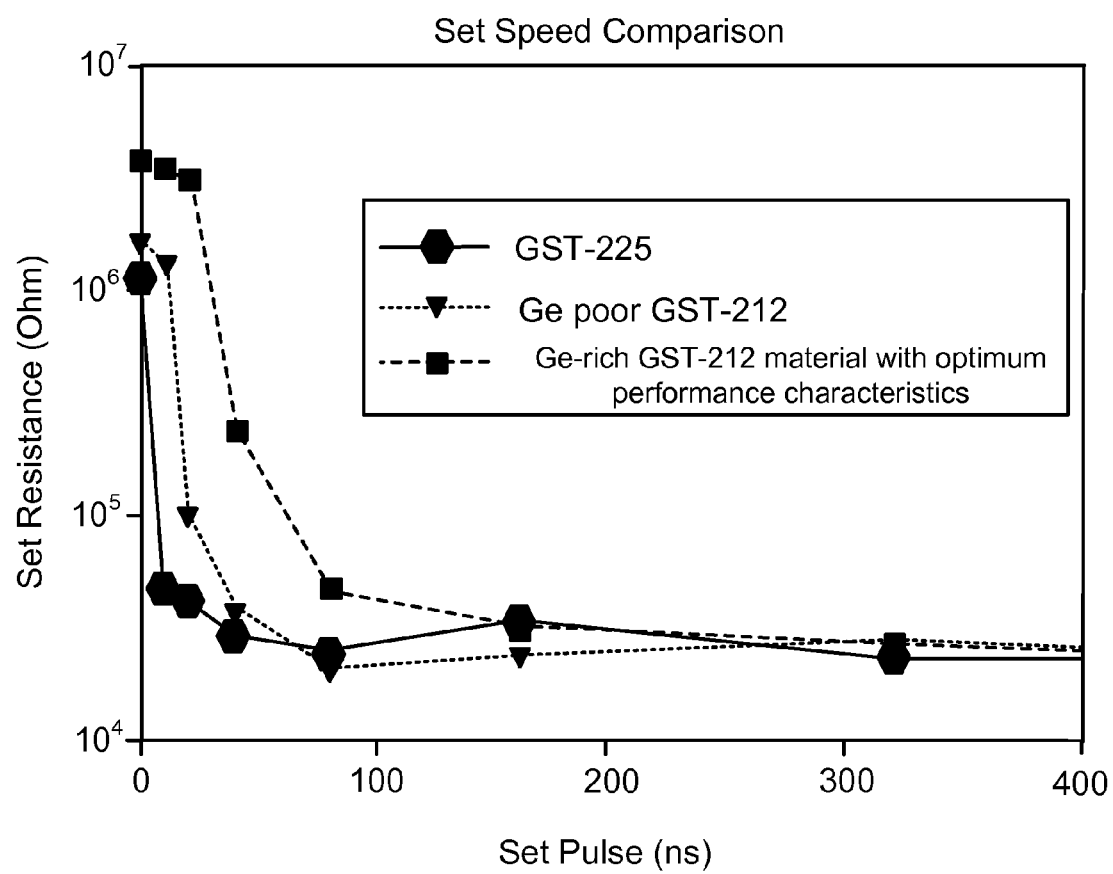
FIG. 10 is a plot of the set resistance as a function of set pulse time for various materials both in the GST-212 family and in the GST-225 family.

FIG. 10 is a graph of the set resistance as a function of set pulse time for various materials both within the GST-212 family and the GST-225 family. The memory cells used to generate the data of FIG. 10 are the same as the previously mentioned devices used to generate the data in FIGS. 8 and 9. FIG. 10 illustrates wherein a set crystalline state resistance level is achieved using an 80 ns set pulse. As shown in FIG. 10, a set crystalline state resistance of below $10^5 \Omega$ is achieved in the GST-212 material using a set pulse of a time length that is comparable to the set pulse time that is used to achieve a set crystalline state resistance in GST-225. This further illustrates that while the performance characteristics of the device at elevated temperatures is improved, desired fast set pulse times are still preserved.

Figure 11:
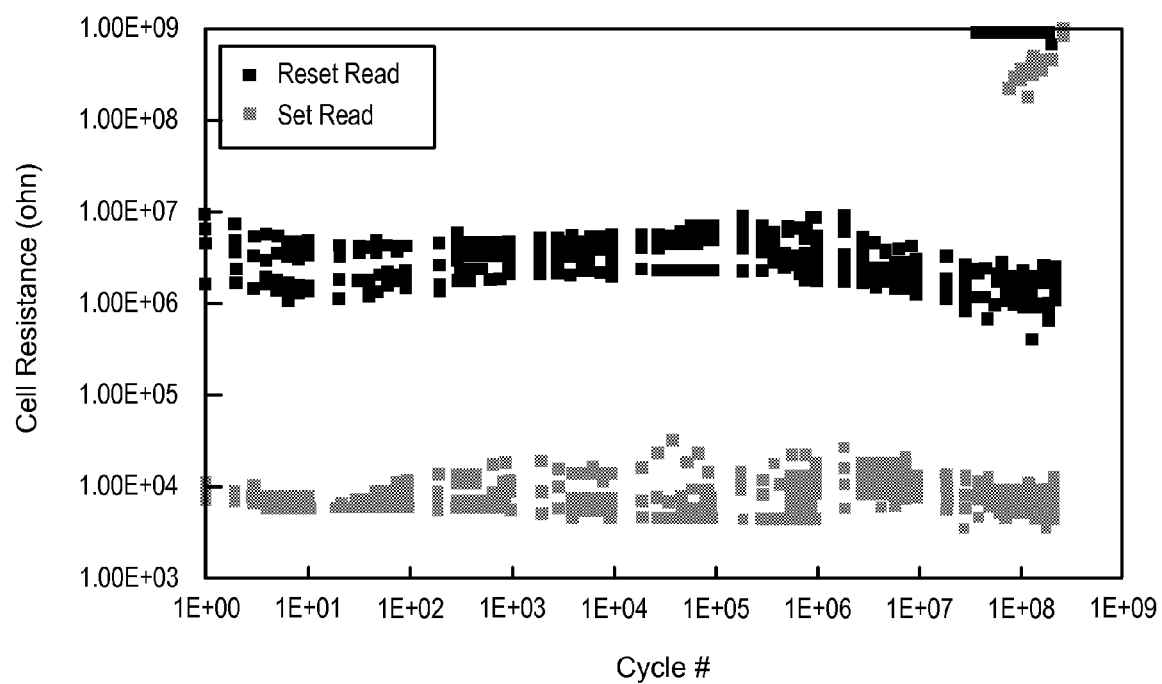
FIG. 11 is the resistance of cells in both the crystalline set state and the amorphous reset state as a function of operational cycles of a memory cell fabricated of a material with optimum performance characteristics from the GST-212 family.

Materials within the GST-212 family have only a slightly higher resistance drift coefficient than undoped GST-225. FIG. 11 shows the cell resistance in both the crystalline set state and the amorphous reset state as a function of the number of cycles of transforming the memory cell between a set state and a reset state in each cycle. The tested memory cells used to generate the data illustrated in FIG. 11 are of the same structure as used to generate the data in FIGS. 8 and 9. Furthermore such memory cells are fabricated from an optimum performance characteristic material within the GST-212 family. As shown in FIG. 11, the resistance drift coefficient of the material within the GST-212 family is 0.102. This resistance drift coefficient is only slightly higher than 0.096, the typical resistance drift coefficient of materials within the undoped GST-225 family. Thus, at normal operating temperatures, memory cells fabricated from materials within the GST-212 family do not experience significant changes in resistance values for both the set and reset states during numerous operational cycles. Such desirable performance characteristic is similar to the characteristic of lack of variation in set and reset state resistance values during numerous operational cycles that is observed in memory cells fabricated from materials within the undoped GST-225 family.

Figure 12:
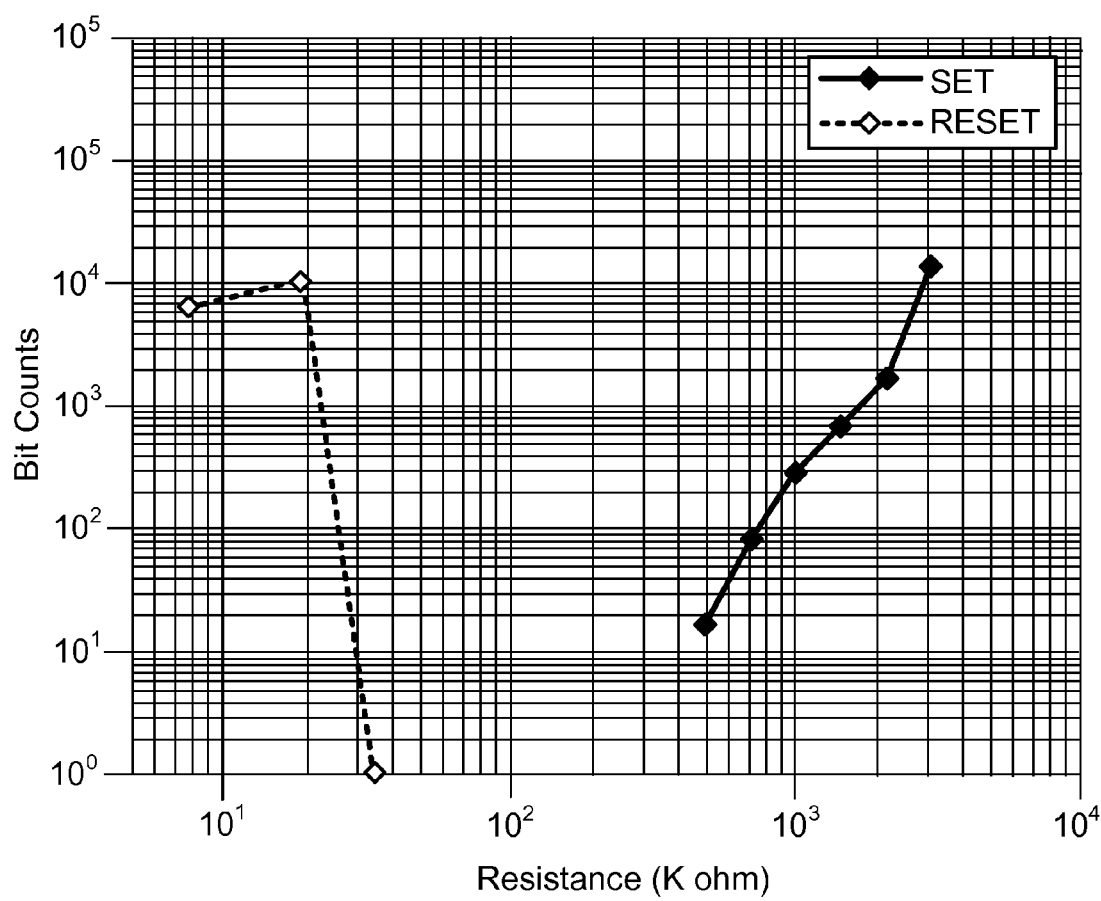
FIG. 12 is plot of the bit counts of a memory cell fabricated from a material with optimum performance characteristics from the GST-212 family as a function of resistance.

FIG. 12 shows the bit counts of memory cells fabricated from the representative composition with a atomic percentage concentration of Ge around 42.9%, a atomic percentage concentration of Sb around 20.5% and a atomic percentage concentration of Te around 36.6% as a function of resistance. As is shown in FIG. 12, $10^4$ memory cells within the array retained set state resistances while over $10^4$ memory cells within the array retained reset state resistances during device testing. The variations in crystalline set state resistance values are confined to a narrow range between 5 kΩ and 20 kΩ. Meanwhile the variations in amorphous reset state resistance values are confined to a narrow range between 400 kΩ and 2000 kΩ. Such narrow distribution of resistance values within confined and separated ranges, further illustrates the previously mentioned desired performance characteristic, wherein the set and reset state resistance values remain separate and relatively constant within a narrow range after numerous operational cycles.

Figure 13:
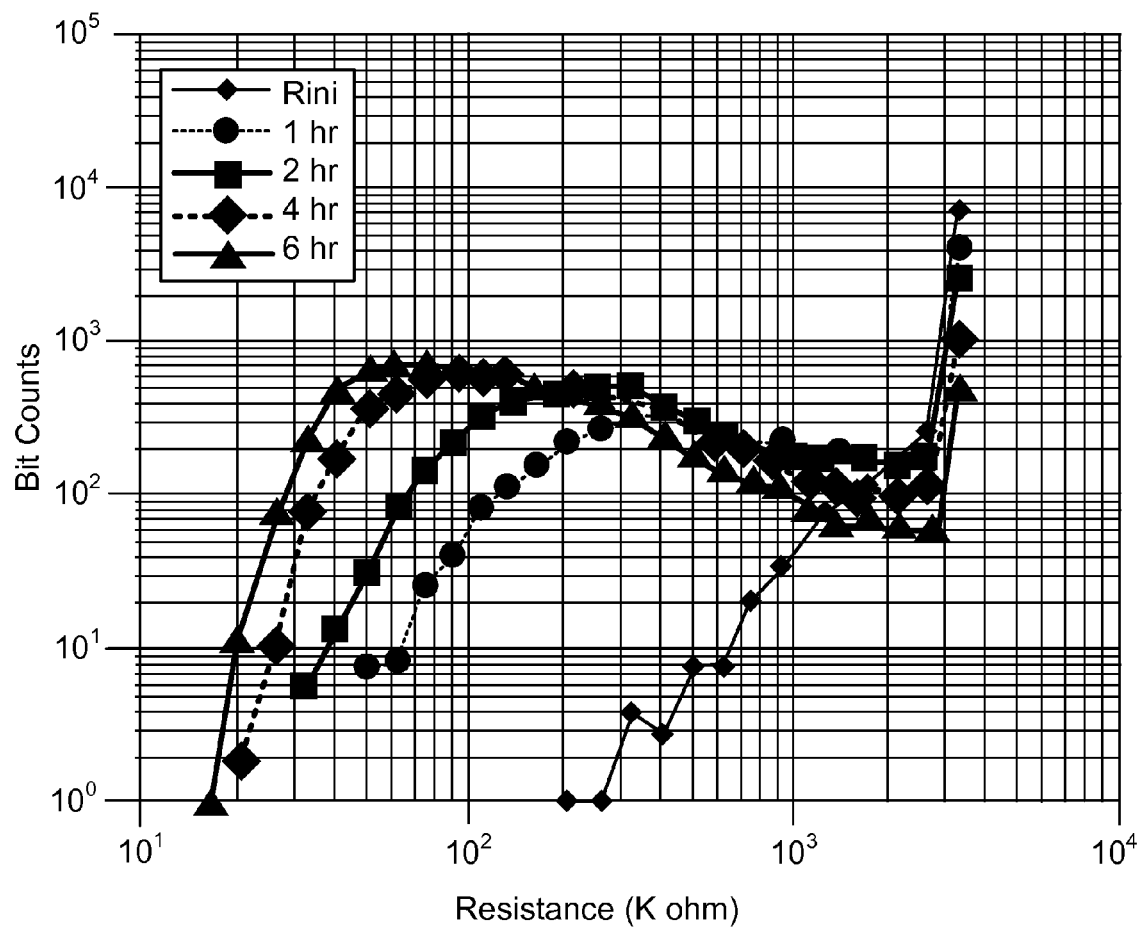
FIG. 13 is a plot of the bit counts of a memory cell fabricated from a material with optimum performance characteristics from the GST-212 family as a function of resistance after exposure to 190° C. for various periods of time.

Memory cells fabricated from materials within the GST-212 family maintain high data retention levels and have low instances of the creation of false data after exposure to high temperatures for long periods of time. FIG. 13 illustrates the bit counts as a function of reset state resistance for an array of memory cells fabricated from the representative composition after the memory cells are baked at 190° C. for various lengths of time. The memory cells used to generate the data of FIG. 13 are the same as those that were used to generate the data in FIGS. 8 and 9. The memory cells were baked for times ranging from 1 hour up to 6 hours. Even after 6 hours of baking the memory cells still retained the same reset state resistances as memory cells that were baked for only one hour. Thus, memory cells fabricated from the GST-212 family are capable of maintaining amorphous reset state resistance values during repeated cyclical operation of the memory cell at exposure to elevated temperatures for long periods of time.

Figure 14:
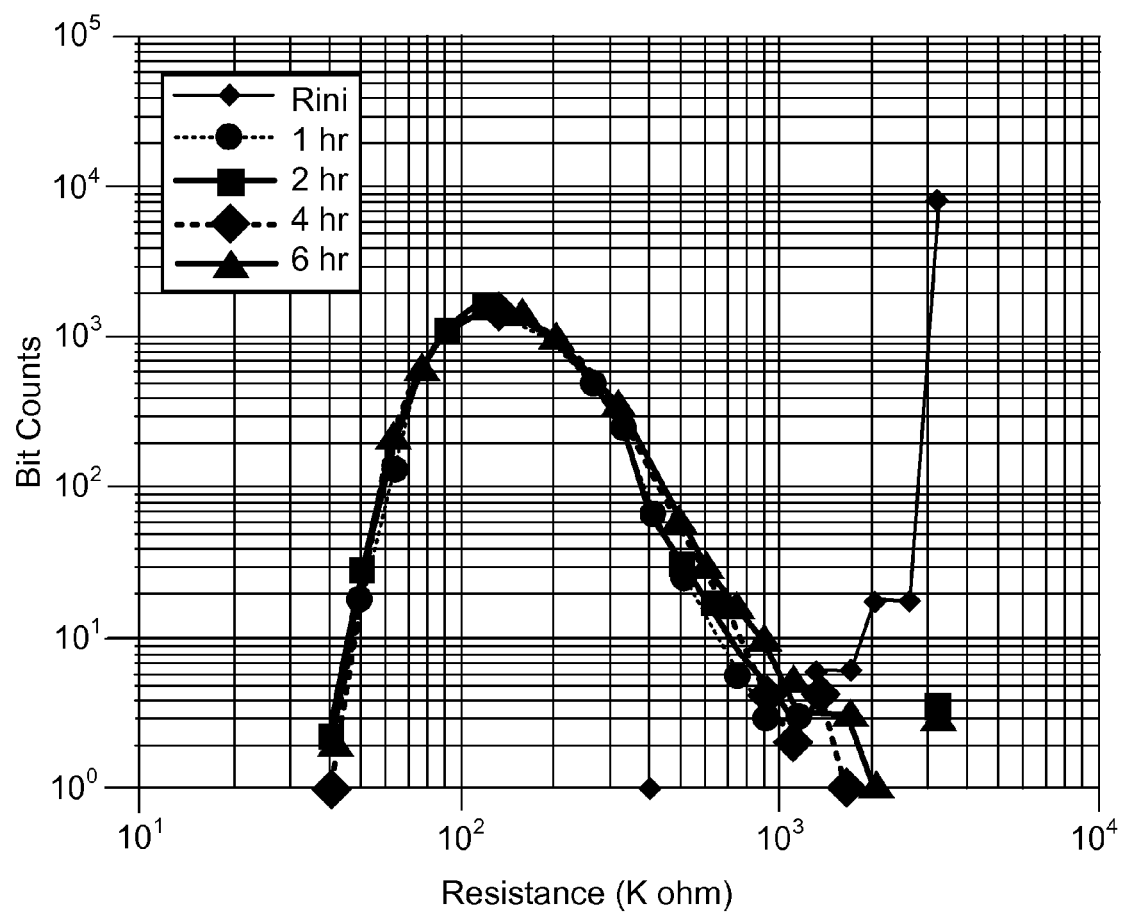
FIG. 14 is a plot of the bit counts of a memory cell fabricated from a material from the GST-225 family as a function of resistance after exposure to 190° C. for various periods of time.

FIG. 14 illustrates the bit counts as a function of reset state resistance for an array of memory cells fabricated from materials within the $SiO_2$ doped GST-225 family after exposure to 190° C. for various periods of time. The array of memory cells fabricated from the $SiO_2$ doped GST-225 material were exposed to 190° C. temperatures for a time period ranging from 1 hour to 6 hours. FIG. 14 shows the amorphous reset state resistance of the array of memory cells after such exposure to elevated temperature for various times. It is clear from FIG. 14 that the number of memory cells within the array that were at the higher amorphous reset state resistance dropped dramatically after only just 1 hour of exposure to temperatures at 190° C. Alternatively, memory cells fabricated from material within the GST-212 family, as shown in FIG. 13, maintained amorphous reset state resistance values as high as 2000 kΩ even after 6 hours of exposure to a temperature of 190° C. Thus, memory cells fabricated from materials of the GST-212 family maintain better high temperature performance characteristics, including excellent data retention rates, as opposed to memory cells fabricated from materials in the GST-225 family.

Figure 15:
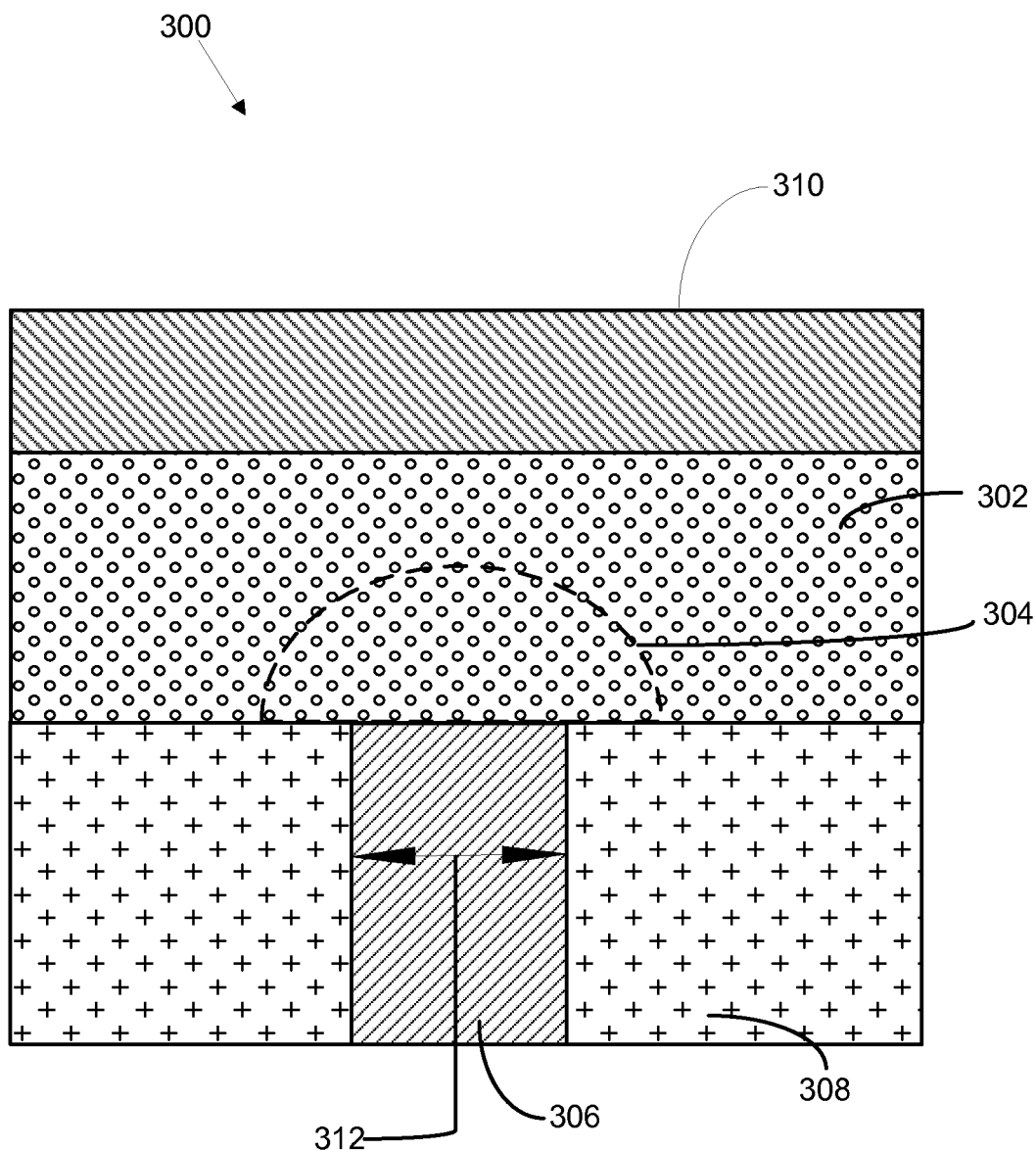
FIG. 15 is a cross-sectional view of a memory cell with a memory element that is made from a material with a bulk stoichiometry of a material from the GST-212 family.

FIG. 15 illustrates a cross-sectional view of a memory cell 300 that is fabricated from a GST-212 material. The memory cell 300 comprises a memory element 302 consisting of a body of memory material, wherein the bulk stoichiometry of the phase change memory material is in the GST-212 family. The memory cell 300 includes an active region 304. The memory cell 300 includes a first electrode 306 extending through dielectric layer 308 to contact a bottom surface of the memory element 302. A second electrode 310 is formed on the memory element 302 to create a current between the first electrode 306 and second electrode 310 through the memory element 302. The first and second electrodes 306 and 310 may comprise, for example, TiN or TaN. Alternatively, the first and second electrodes 306 and 310 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof. The dielectric layer 308 may comprise silicon nitride, silicon oxynitride, silicon oxide and any other suitable dielectric material.

The described memory cell has a first electrode 306 with a relatively narrow width 312 (which in some embodiments is a diameter). The narrow width 312 of the first electrode 306 results in an area of contact between the first electrode 306 and the memory element 302 that is less than the area of contact between the memory element 302 and the second electrode 310. Thus, current is concentrated in the portion of the memory element 302 adjacent the first electrode 306, resulting in the active region 304 being in contact with or near the first electrode 306, as shown. The memory element 302 also includes an inactive region outside the active region 304, which is inactive in the sense that it does not undergo phase transitions during operation. Even though the inactive region outside of the active region 304 does not undergo phase transformations during device operation the bulk stoichiometry of the entire memory element including the active region 304 and the inactive region is comprised of GST-212 phase change memory material.

Figure 16:
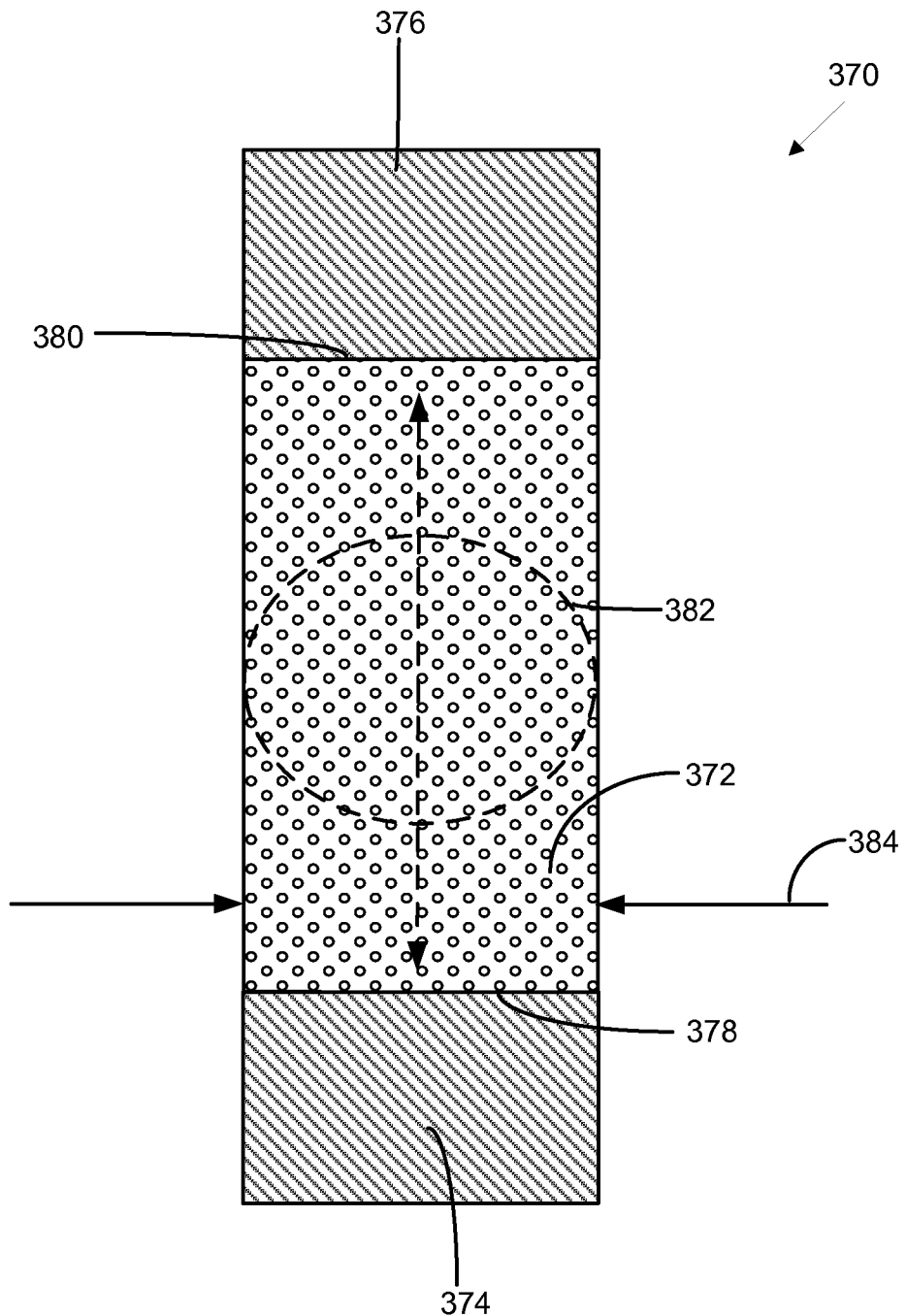
FIG. 16 is a cross-sectional view of an alternative memory cell design with a memory element that is made from a material with a bulk stoichiometry of a material from the GST-212 family.

FIG. 16 illustrates a cross-sectional view of an alternative memory cell 370 design. Memory cell 370 includes a memory element 372 consisting of a body of phase change material having a bulk stoichiometry of a material from the GST-212 family in an inter-electrode current path through memory element 372. The memory element 372 is in a pillar shape and contacts first and second electrodes 374 and 376 at top and bottom surfaces 378 and 380, respectively. The memory element 372 has a width 384 substantially the same as that of the first and second electrodes 374 and 376 to define a multi-layer pillar surrounded by dielectric (not shown). As used herein, the term "substantially" is intended to accommodate manufacturing tolerances. In operation, as current passes between the first and second electrodes 374 and 376 and through the memory element 372, the active region 382 heats up more quickly than the other regions within the memory element. This leads to a majority of the phase transformation occurring within the active region during device operation.

Figure 17:
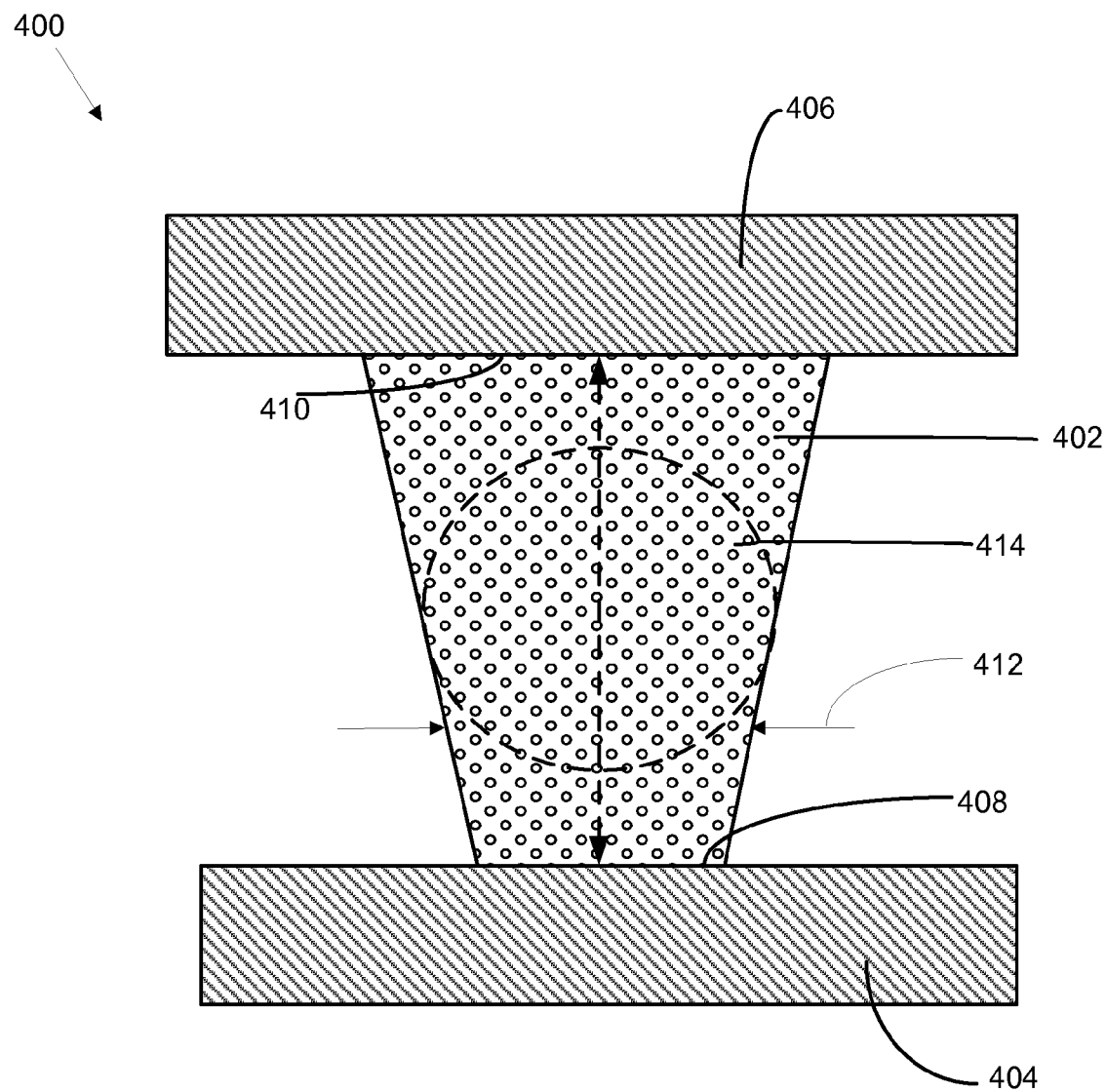
FIG. 17 is a cross-sectional view of an alternative memory cell design with a memory element that is made from a material with a bulk stoichiometry of a material from the GST-212 family.

FIG. 17 illustrates a cross-sectional view of an alternative memory cell 400 design. The memory cell 400 includes a memory element 402 consisting of a body of phase change material having a bulk stoichiometry of a material from the GST-212 family in an inter-electrode current path through the memory element 402. The memory element 402 is surrounded by dielectric (not shown) contacting first and second electrodes 404 and 406 at top and bottom surfaces 408 and 410, respectively. The memory element 402 has a varying width 412 that is always less than the width of the first and second electrodes. In operation, as current passes between the first and second electrodes 404 and 406 and through the memory element 402 the active region 414 heats up more quickly than the remainder of the memory element. Thus the volume of memory element 402 within the active region is where a majority of the phase transformation occurs during device operation.

As will be understood, the memory material from the GST-212 family, as described herein, can be used in a variety of memory cell structures and is not limited to the memory cell structures described herein.

Figure 18:
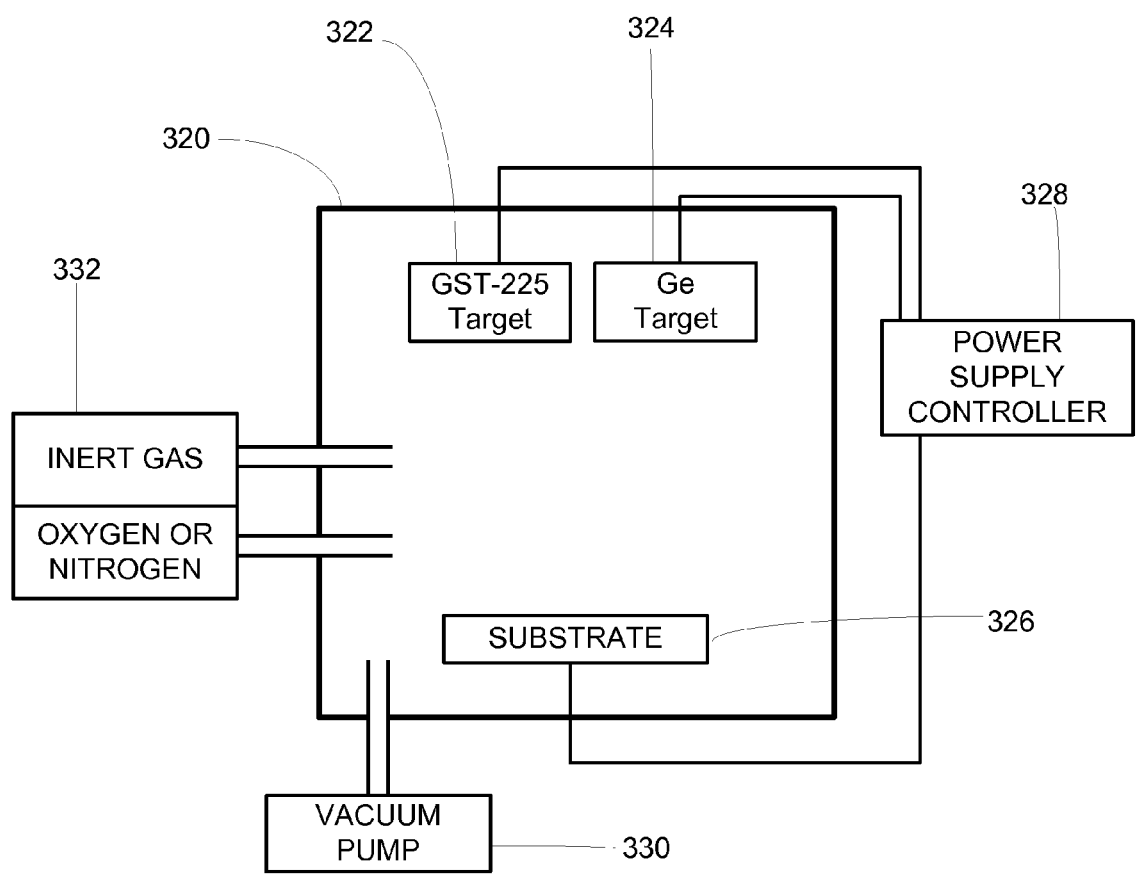
FIG. 18 is a simplified diagram of a method of creating a GST-212 memory device through a sputtering system.

FIG. 18 is a simplified diagram of a method of creating a GST-212 memory device through a sputtering system. The sputtering system includes a chamber 320 in which a GST-225 sputter target 322, a Ge sputter target 324 and a substrate 326 are mounted. The sputter targets 322 and 324 and substrate 326 are coupled to a power supply and controller 328 that are used to apply bias voltages during the sputtering process. Bias voltages applied can be DC, pulsed DC, radio frequency, and combinations thereof, and turned on and off and modulated by the controller, as suits a particular sputtering process. The sputter chamber 320 is equipped with a vacuum pump 330 or other means for evacuating the chamber and removing exhaust gases. Also, the chamber is configured with a gas source 332. In one embodiment of the present invention the gas source 332 is a source for an inert gas such as argon. In addition, some embodiments may include a gas source 332 of the reaction gas, such as oxygen or nitrogen in the examples for use in causing addition of other components in the bulk GST-212. The system has the ability to dynamically control the flow of gases from the source 332 in order to have an effect on the composition of the layer being formed in the sputtering process. The power applied the power supply and controller 328 to the Ge sputter target 324 can be used to control the composition of the as deposited layer, so that it falls in the GST-212 family of materials.

A collimator (not shown) can be used when sputtering a substrate that includes high aspect ratio features, to improve the uniformity of coverage over the high aspect ratio features, and for other reasons. Some sputtering systems have the ability to move a collimator into and out of the sputtering chamber as needed.

It will be appreciated that this is a simplified diagram sufficient for heuristic purposes of description herein. Sputter chambers are standard equipment in semiconductor manufacturing factories, and available from a variety of commercial sources.

Figure 19:
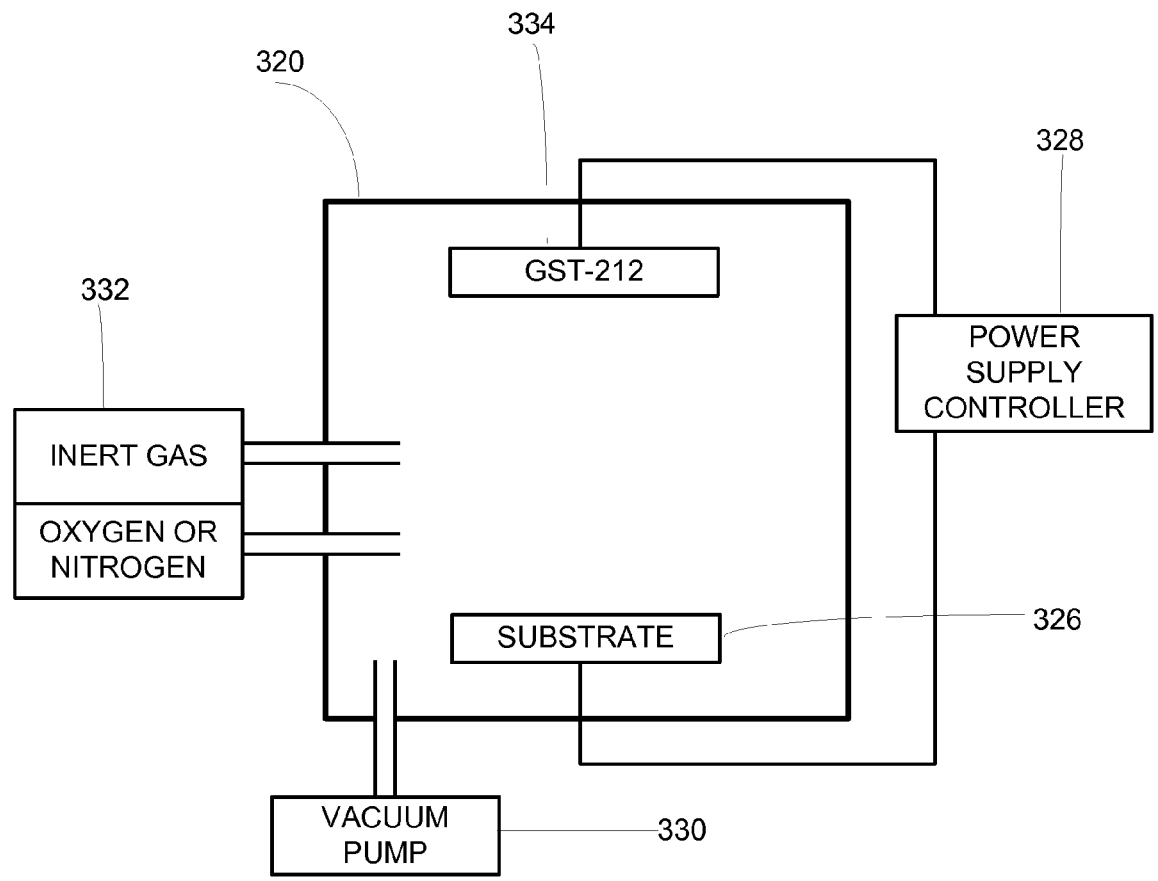
FIG. 19 is a simplified diagram of a method of creating a GST-212 memory device through an alternative sputtering system.

FIG. 19 is a simplified diagram of a method of creating a memory device out of a material within the GST-212 family through an alternative sputtering system. FIG. 19 differs from the sputtering system of FIG. 18 in that the sputtering target 334 is comprised of a material in the GST-212 family, and a separate Ge sputtering target is not utilized. Therefore the entire GST-212 material that is deposited onto the substrate comes from a GST-212 target and not a GST-225 target in combination with a Ge target.

Figure 20:
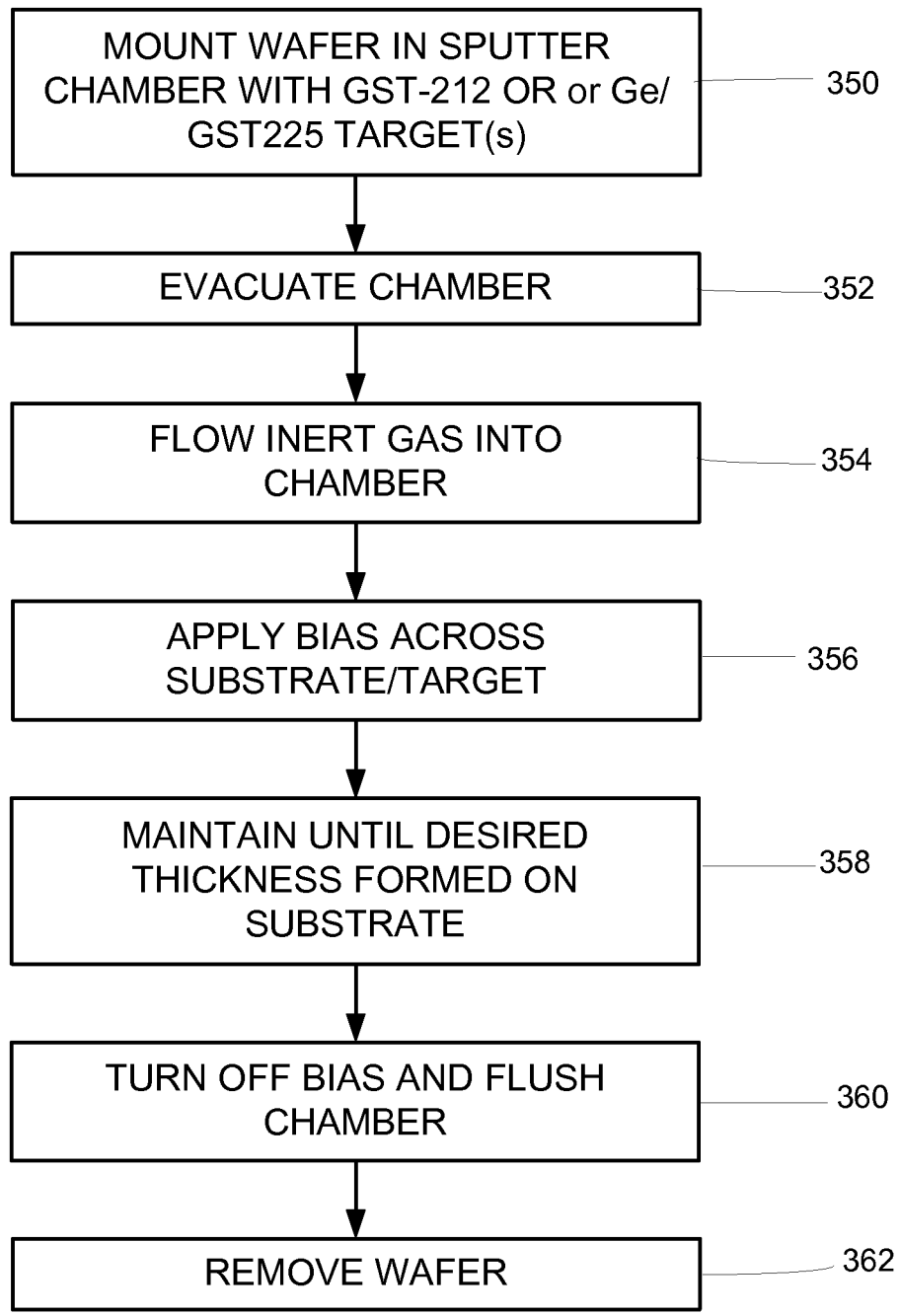
FIG. 20 is a process flow for forming a layer of GST-212 phase change material using a sputtering system.
Figure 21:
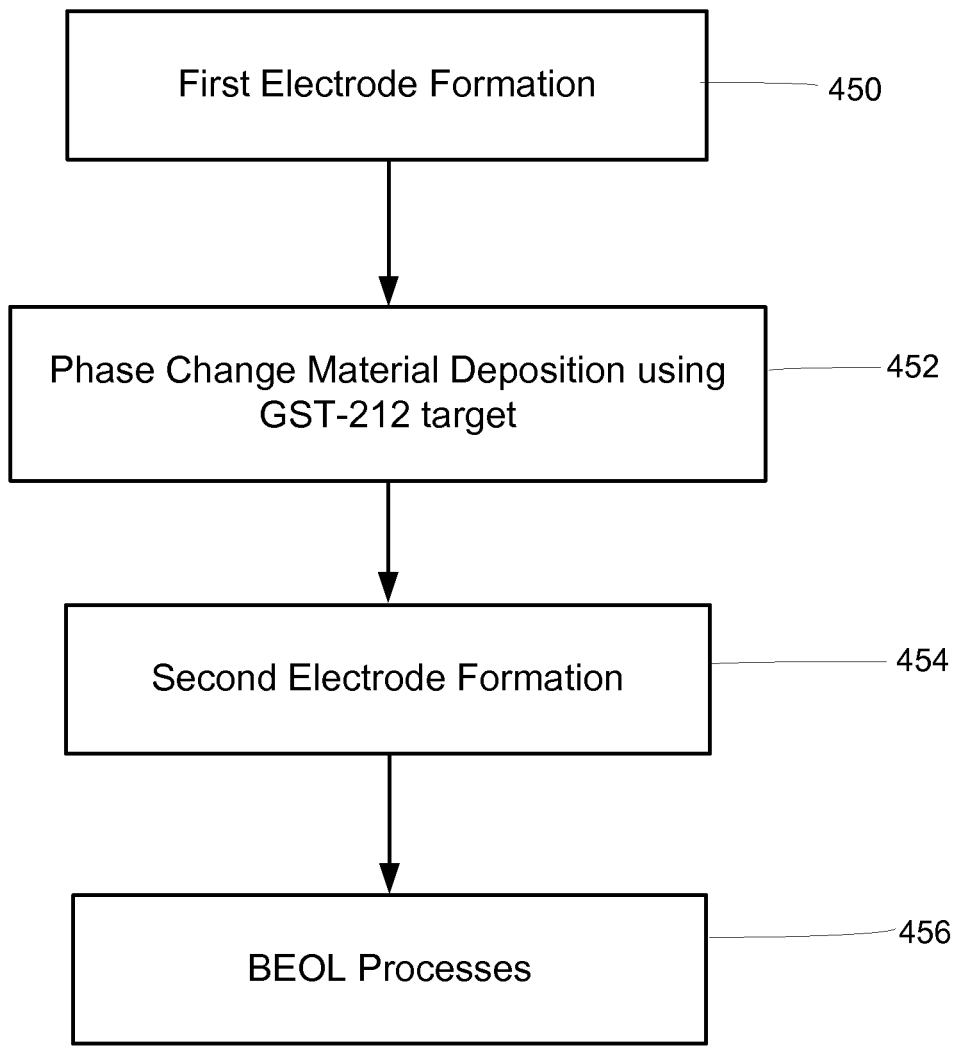
FIG. 21 is a manufacturing process flow for fabricating a memory cell from a GST-212 material.

FIG. 20 illustrates a process flow for forming a layer of GST-212 phase change material using either of the previously described methods. The process includes first mounting the wafer in a sputter chamber having the germanium and GST-225 phase change material targets, or a GST-212 family of material composition target (350). Next, the chamber is evacuated (352) to allow for the creation of a flow of ions sputtered from the target source or sources. An inert gas such as argon is flowed into the chamber, to establish an atmosphere suitable for sputtering (354). Suitable bias voltages are applied across the substrate and targets, such as a DC bias, to establish an electric field within the sputter chamber necessary to induce the sputtering process (356). Optionally, a pre-sputtering interval can be executed to prepare the target before exposing the wafer to the sputtering atmosphere. The conditions for sputtering are maintained with the wafer exposed, for an interval of time sufficient to obtain the desired thickness of memory material on the substrate (358). The bias is turned off, and the chamber is flushed (360). Finally, the wafer or substrate with deposited GST-212 layer is removed (362). FIG. 21 illustrates a manufacturing process flow for manufacturing a memory cell including a memory element with a structure of the memory cell shown in FIG. 15, wherein the bulk stoichiometry of the memory element is of a material from the GST-212 family. Reference numerals applied to elements of the memory cell correspond to those used in FIG. 15. At step 450 the first electrode 306 having a width or diameter 312 is formed extending through dielectric layer 308. The first electrode 306 comprises TiN and the dielectric layer 308 comprises SiN. Alternatively the first electrode 306 can have a sublithographic width or diameter 312.

The first electrode 306 extends through dielectric layer 308 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode 306 and the dielectric layer 308 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode" (now U.S. Publication 2008/0191187), which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode 306. Next, the mask of photoresist is trimmed, using for example oxygen plasma, to form a mask structure having sublithographic dimensions overlying the location of the first electrode 306. Then the layer of electrode material is etched using the trimmed mask of photoresist, thereby forming the first electrode 306 having a sublithographic diameter 312. Next dielectric material is formed and planarized to form dielectric layer 308.

At step 452 a phase change element is formed having a bulk stoichiometry of a phase change material from the GST-212 family. The phase change element is formed by any of the previously mentioned sputter system methods as described above.

Next, at step 454 a second electrode 310 is formed and at step 456 back-end-of-line (BEOL) processing is performed to complete the semiconductor process steps of the chip, resulting in the structure illustrated in FIG. 19. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to periphery circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 14 are formed on the device.

Figure 22:
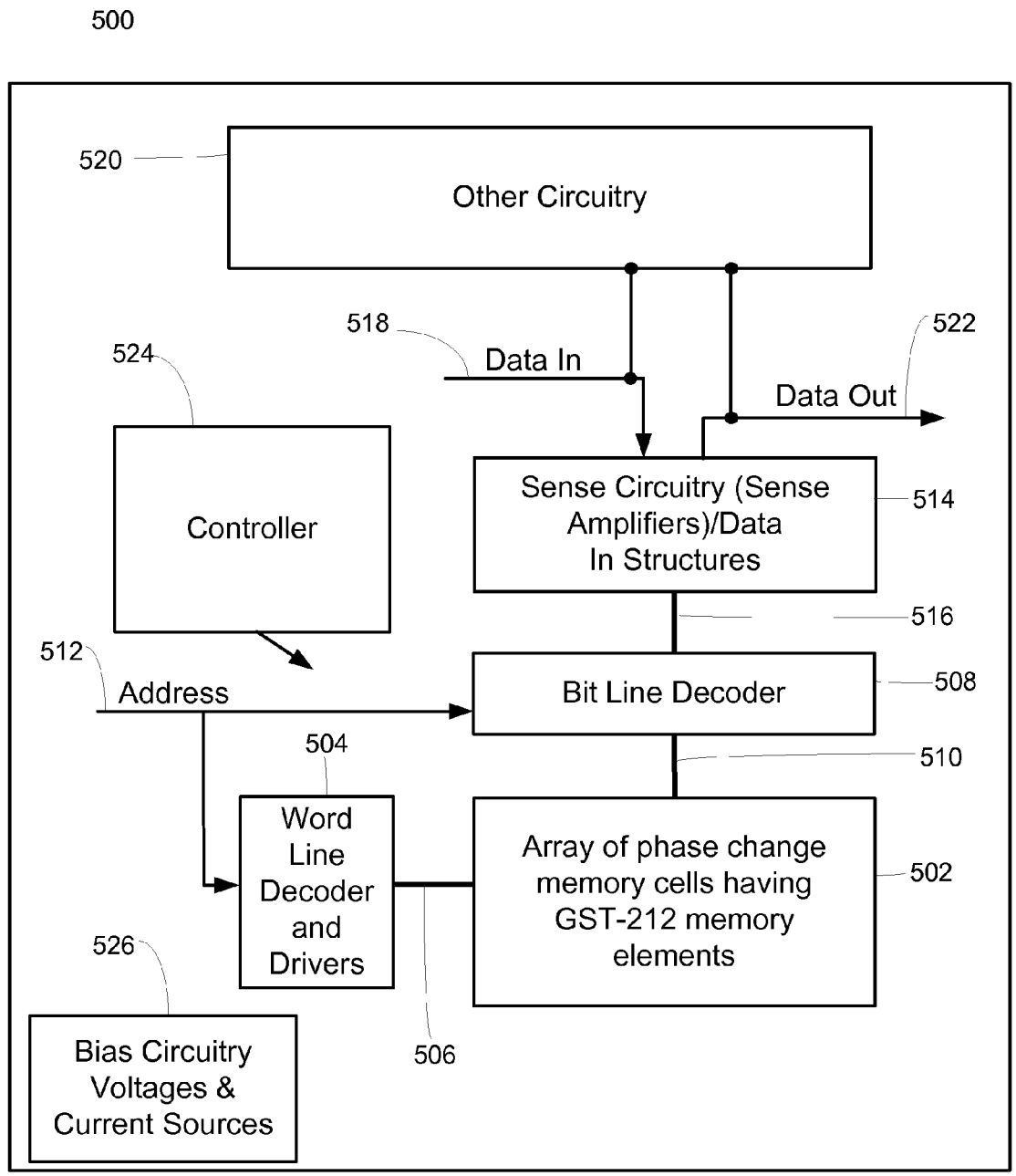
FIG. 22 is a simplified block diagram of an integrated circuit implementing an array of memory cells fabricated from a GST-212 material.

FIG. 22 is a simplified block diagram of an integrated circuit 500 including a memory array 502 having memory cells with memory elements comprised of materials with a bulk stoichiometry of a material within the GST-212 family. A word line decoder 504 having read, set and reset modes is coupled to and in electrical communication with a plurality of word lines 506 arranged along rows in the memory array 502. A bit line (column) decoder 508 is in electrical communication with a plurality of bit lines 510 arranged along columns in the array 502 for reading, setting, and resetting the phase change memory cells (not shown) in array 502. Addresses are supplied on bus 512 to word line decoder and drivers 504 and bit line decoder 508. Sense circuitry (Sense amplifiers) and data-in structures in block 514, including voltage and/or current sources for the read, set, and reset modes are coupled to bit line decoder 508 via data bus 516. Data is supplied via a data-in line 518 from input/output ports on integrated circuit 500, or from other data sources internal or external to integrated circuit 500, to data-in structures in block 514. Other circuitry 520 may be included on integrated circuit 500, such as a general purpose processor or special purpose application circuitry, or a combination of modules providing system-on-a-chip functionality supported by array 502. Data is supplied via a data-out line 522 from the sense amplifiers in block 514 to input/output ports on integrated circuit 500, or to other data destinations internal or external to integrated circuit 500.

A controller 524 implemented in this example, using a bias arrangement state machine, controls the application of bias circuitry voltage and current sources 526 for the application of bias arrangements including read, program, erase, erase verify and program verify voltages and/or currents for the word lines and bit lines. In addition, bias arrangements for melting/cooling cycling may be implemented. Controller 524 may be implemented using special-purpose logic circuitry as known in the art. In alternative embodiments, controller 524 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 524.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A phase change memory device comprising:
   a first electrode and second electrode;
   a body of phase change memory material between the first and second electrodes in a GST-212 family, wherein the bulk stoichiometry of the body of phase change memory material includes a Ge atomic concentration within a range from 30% to 65%, a Sb atomic concentration within a range from 13% to 27% and a Te atomic concentration within a range from 20% to 45%, and around the Ge—Sb$_2$Te$_3$ phase diagram tie line; and
   a controller which applies a set pulse having a duration of less than 100 nanoseconds to change the phase change material from an amorphous phase to a crystalline phase.

2. The device of claim 1, wherein the body of the phase change memory material has a crystallization temperature greater than 170° C.

3. The device of claim 1, wherein the body of the phase change memory material crystallizes through a growth dominated mechanism.

4. A phase change memory device comprising:
   a first electrode and second electrode;
   a body of phase change memory material between the first and second electrodes in a GST-212 family, wherein the bulk stoichiometry of the body of phase change memory material includes a Ge atomic concentration within a range from 40% to 65%, a Sb atomic concentration within a range from 13% to 27% and a Te atomic concentration within a range from 20% to 45%, and around the Ge—Sb$_2$Te$_3$ phase diagram tie line; and
   a controller which applies a set pulse having a duration of less than 100 nanoseconds to change the phase change material from an amorphous phase to a crystalline phase.

5. The device of claim 4, wherein the body of the phase change memory material has a crystallization temperature greater than 200° C.

6. The device of claim 4, wherein the body of the phase change memory material crystallizes through a growth dominated mechanism.

7. A method for manufacturing a phase change memory device, the method comprising:
- forming a first electrode;
- forming a body of phase change memory material in a GST-212 family, in contact with the first electrode wherein a Ge atomic concentration is within a range from 30% to 65%, a Sb atomic concentration is within a range from 13% to 27% and a Te atomic concentration is within a range from 20% to 45%, and around the Ge—$Sb_2Te_3$ phase diagram tie line;
- forming a second electrode in contact with the body of phase change memory material; and
- applying a set pulse having a duration of less than 100 nanoseconds to change the phase change material from an amorphous phase to a crystalline phase.

8. The method of claim 7, wherein said forming a body comprises co-sputtering from a GST-225 target and a Ge target.

9. The method of claim 7, wherein said forming a body comprises sputtering from a GST-212 target.

10. The method of claim 7, wherein the bias voltage that is applied between the Ge target and the substrate is used to control the concentration of the Ge in the body of phase change memory material.

11. The method of claim 7 further including the step of performing back-end-of-line processing after the second electrode is formed.

12. The method of claim 7, wherein the phase change memory material has a Ge atomic concentration within a range from 40% to 65%.

* * * * *